(12) United States Patent
Yabuta et al.

(10) Patent No.: US 12,321,107 B2
(45) Date of Patent: Jun. 3, 2025

(54) EXTREME ULTRAVIOLET LIGHT SOURCE DEVICE AND PROTECTION METHOD FOR RECEIVING PLATE MEMBER

(71) Applicant: USHIO DENKI KABUSHIKI KAISHA, Tokyo (JP)

(72) Inventors: Hironobu Yabuta, Tokyo (JP); Nobuaki Miyagawa, Tokyo (JP)

(73) Assignee: USHIO DENKI KABUSHIKI KAISHA (JP)

( * ) Notice: Subject to any disclaimer, the term of this patent is extended or adjusted under 35 U.S.C. 154(b) by 204 days.

(21) Appl. No.: 18/026,803

(22) PCT Filed: Aug. 5, 2021

(86) PCT No.: PCT/JP2021/029103
§ 371 (c)(1),
(2) Date: Mar. 16, 2023

(87) PCT Pub. No.: WO2022/079986
PCT Pub. Date: Apr. 21, 2022

(65) Prior Publication Data
US 2023/0324815 A1 Oct. 12, 2023

(30) Foreign Application Priority Data
Oct. 12, 2020 (JP) .................................. 2020-171636

(51) Int. Cl.
*G03F 7/00* (2006.01)
*H05G 2/00* (2006.01)

(52) U.S. Cl.
CPC ...... *G03F 7/70916* (2013.01); *G03F 7/70033* (2013.01); *H05G 2/008* (2013.01)

(58) Field of Classification Search
CPC .... G03F 7/70033; G03F 7/70916; G03F 1/64; H05H 1/24; H05G 2/005; H05G 2/008; H05G 2/003
See application file for complete search history.

(56) References Cited

U.S. PATENT DOCUMENTS

| 9,894,744 | B2 |  | 2/2018 | Iwamoto et al. |
| 11,774,856 | B2 | * | 10/2023 | Kikuiri ............... G03F 7/70033 |
|  |  |  |  | 250/504 R |

(Continued)

FOREIGN PATENT DOCUMENTS

| EP | 2321704 B1 | 6/2018 |
| JP | 2016-181353 A | 10/2016 |

(Continued)

OTHER PUBLICATIONS

Machine Translation of JP 2016181353 A.*

(Continued)

*Primary Examiner* — Deoram Persaud
(74) *Attorney, Agent, or Firm* — Harness, Dickey & Pierce, P.L.C.

(57) ABSTRACT

An extreme ultraviolet light source apparatus includes a light source part for generating a plasma that emits extreme ultraviolet light with use of excitation of a raw material for emitting extreme ultraviolet light; a storage vessel for storing a melt of a waste material including the raw material and a melt of particles of debris that are emitted from the plasma; a receiving plate member having a receiving surface; and a corrosion-resistant member disposed on the receiving surface of the receiving plate member, the corrosion-resistant member being more corrosion-resistant to the melt of the waste material and the melt of the debris than the receiving plate member, the corrosion-resistant member receiving the melt of the waste material and the melt of the debris and (Continued)

guiding the melt of the waste material and the melt of the debris into the storage vessel.

15 Claims, 16 Drawing Sheets

(56) References Cited

U.S. PATENT DOCUMENTS

| | | | | |
|---|---|---|---|---|
| 2010/0258748 | A1* | 10/2010 | Vaschenko | H05G 2/003 |
| | | | | 250/504 R |
| 2012/0248343 | A1* | 10/2012 | Nagai | G03F 7/70033 |
| | | | | 250/504 R |
| 2016/0195714 | A1* | 7/2016 | Metzmacher | H05H 1/44 |
| | | | | 359/508 |
| 2017/0350745 | A1 | 12/2017 | Nagano et al. | |
| 2019/0150264 | A1* | 5/2019 | Kamikanna | H05G 2/00 |
| | | | | 137/312 |
| 2021/0247702 | A1* | 8/2021 | Chen | H05G 2/005 |
| 2023/0418170 | A1* | 12/2023 | Ashizawa | G03F 7/70916 |
| 2023/0418171 | A1* | 12/2023 | Yabuta | G03F 7/70166 |

FOREIGN PATENT DOCUMENTS

| | | |
|---|---|---|
| JP | 6176138 B2 | 8/2017 |
| JP | 2017-219698 A | 12/2017 |
| JP | 6241407 B2 | 12/2017 |
| WO | 2014-121873 A1 | 8/2014 |

OTHER PUBLICATIONS

Extended European Search Report for corresponding Application No. 21879728.0 dated May 6, 2024 (10 Pages).
International Search Report (English and Japanese) issued in PCT/JP2021/029103, mailed Nov. 9, 2021; ISA/JP (5 pages).
Partial European Search Report issued in corresponding Patent Application No. 21879728.0 dated Jan. 18, 2024 (10 Pages).

* cited by examiner

EXTREME ULTRAVIOLET LIGHT SOURCE DEVICE AND PROTECTION METHOD FOR RECEIVING PLATE MEMBER

CROSS REFERENCE TO RELATED APPLICATIONS

This application is a U.S. National Phase application under 35 U.S.C. 371 of International Application No. PCT/JP2021/029103, filed on Aug. 5, 2021, which claims priority to Japanese Patent Application No. 2020-171636, filed on Oct. 12, 2020. The entire disclosures of the above applications are expressly incorporated by reference herein.

BACKGROUND

Technical Field

The present invention relates to extreme ultraviolet light source apparatuses and methods for protecting receiving plate members.

Related Art

Recently, due to increasing miniaturization and integration of semiconductor integrated circuits, shortening of a wavelength of an exposure light source has been promoted. As a next-generation light source for exposing semiconductors, an extreme ultraviolet light source apparatus (hereinafter also referred to as an "EUV light source apparatus") that emits extreme ultraviolet light (hereinafter also referred to as "EUV (extreme ultraviolet) light") having a wavelength of 13.5 nm has been developed.

There are several known methods for generating EUV light (EUV radiation) in EUV light source apparatuses. One method is to generate a plasma by heating and exciting an extreme ultraviolet light radiation subject (hereinafter, also referred to as "EUV radiation subject"), and to generate EUV light emitted from the plasma.

EUV light source apparatuses that employ such a method are classified into an LPP (Laser Produced Plasma) method and a DPP (Discharge Produced Plasma) method, depending on the generation scheme for the plasma.

An EUV light source apparatus of the DPP type applies a high voltage to a gap between electrodes in which a discharge gas containing EUV radiation subject (plasma raw material in gas phase) is supplied, to generate a high-density plasma by discharge, and utilizes extreme ultraviolet light radiated therefrom. As a specific DPP method as disclosed, for example, in JP-A-2017-219698, a method is proposed in which a liquid high-temperature plasma raw material containing the EUV radiation subject (for example, tin (Sn) or lithium (Li)) is supplied to surfaces of electrodes that generate a discharge, an energy beam such as a laser beam is directed to the raw material to vaporize the raw material, and a plasma is generated by the discharge. Such an approach may be referred to as LDP (Laser Assisted Gas Discharge Produced Plasma).

On the other hand, an EUV light source apparatus of the LPP type irradiates a target material with a laser beam and excites the target material to generate a plasma.

The EUV light source apparatus is used as a light source apparatus for a semiconductor exposure apparatus (lithography apparatus) for manufacturing semiconductor devices. Alternatively, the EUV light source apparatus is used as a light source apparatus in an apparatus for inspecting masks used for lithography. That is to say, the EUV light source apparatus is used as a light source apparatus in another optical apparatus (utilizing apparatus), which uses EUV light.

Since EUV light is significantly attenuated in the atmosphere, the region of space through which the EUV light passes from the plasma to the utilizing apparatus is placed in a reduced-pressure atmosphere, that is, in a vacuum environment to reduce attenuation of the EUV light.

On the other hand, debris is emitted at high speed from the plasma in EUV light source apparatuses. The debris includes particles of the plasma raw material, e.g., tin particles when the plasma raw material is tin. When the plasma is generated by the DPP or LDP scheme, the debris also includes particles of the material for the discharge electrodes, which are the results of sputtering of the discharge electrodes due to the plasma generation.

The debris particles may damage or contaminate reflective films of optical elements in the utilizing apparatus and may degrade its performance when they reach the utilizing apparatus. Accordingly, a debris mitigation device (also referred to as a DMT (Debris Mitigation Tool)) has been proposed to trap the emitted debris particles so that the debris particles do not ingress into the utilizing apparatus (JP-A-2017-219698).

In EUV light source apparatuses using the LDP scheme, debris particles are diffused in all directions from the plasma generated in the discharge region. Whereas debris particles emitted toward the utilizing apparatus are trapped by the above-described debris mitigation device, other debris particles that travel in other directions will be likely to adhere to the interior of the EUV light source apparatus if a countermeasure is not implemented.

To prevent the debris from adhering to the interior of the EUV light source apparatus, the electrodes that generate the discharge are surrounded by electrode housings. Each of the electrode housings surrounds the corresponding electrode except for an opening through which EUV light passes toward the utilizing apparatus.

Most of the above-described debris particles that may adhere to the interior of the EUV light source apparatus are captured in the electrode housings. In addition, some of the plasma raw material (tin) supplied to the discharge region by the electrodes may leak out. Such leaked material does not contribute to plasma generation and thus becomes waste material. The above-mentioned leaked material is also captured in the electrode housings.

Since the electrode housings are located near the plasma, they are heated above the melting point of the debris (tin) and the waste material (tin) by EUV and heat radiation from the plasma. Therefore, the debris and the waste material adhering to the inner surfaces of the electrode housings are maintained in liquid phase without solidification.

The debris and the waste material adhering to the inner surfaces of the electrode housings gather in the lowermost portions of the electrode housings by the force of gravity, and are drained outside through drain ports at the bottoms of the electrode housings, thereby falling in the vertical direction.

The debris and the waste material that have fallen in the vertical direction are received in a receiving plate member, and are stored in a debris storage vessel (or tin dump if the plasma raw material is tin) via the receiving plate member. The debris storage vessel is provided with a heating unit that heats the debris storage vessel to above the melting point of the plasma raw material. In other words, the waste material received by the debris storage vessel is immediately melted and accumulated in the debris storage vessel in a liquefied state.

As described above, the debris and waste materials in liquid phase are drained outside through the drain ports of the electrode housings and fall in the vertical direction. The receiving plate member is heated above the melting point of tin by heating means to prevent the received debris and waste material from solidifying. The receiving plate is made of, for example, stainless steel because of heat resistance, workability, and economy.

Since the debris and waste material received by the receiving plate member are in liquid phase, the temperature thereof is above the melting point of tin. In a case in which the receiving plate member continuously receives tin at a high temperature, the stainless steel, which is the base material of the receiving plate member, reacts with tin and is corroded with tin. When the corrosion of the receiving plate member progresses, heating means embedded in the receiving plate member is exposed through the corroded portions, and the heating means itself is damaged by tin.

Accordingly, it is an object of the present invention to provide an extreme ultraviolet light source apparatus and a method for protecting a receiving plate member that can improve the corrosion resistance of the receiving surface of the receiving plate member that receives the waste material or debris.

SUMMARY

In accordance with an aspect of the present invention, there is provided an extreme ultraviolet light source apparatus, including a light source part configured to generate a plasma that emits extreme ultraviolet light with use of excitation of a raw material for emitting extreme ultraviolet light; a storage vessel configured to store a melt of a waste material including the raw material and a melt of particles of debris that are emitted from the plasma; a receiving plate member having a receiving surface; and a corrosion-resistant member disposed on the receiving surface of the receiving plate member, the corrosion-resistant member being more corrosion-resistant to the melt of the waste material and the melt of the debris than the receiving plate member, the corrosion-resistant member receiving the melt of the waste material and the melt of the debris and guiding the melt of the waste material and the melt of the debris into the storage vessel.

In this aspect, it is possible to protect the receiving surface of the receiving plate member from corrosion caused by the melt of the waste material and by the melt of the debris, while guiding the melt of the waste material and the melt of the debris into the storage vessel, thereby preventing corrosion of the receiving surface of the receiving plate member.

In an embodiment, the light source part may include a pair of disk-shaped discharge electrodes spaced apart from each other; motors each configured to rotate the corresponding discharge electrode about a rotational shaft thereof; containers each configured to store the raw material in liquid phase such that a portion of the corresponding discharge electrode is immersed in the raw material; at least one electrode housing surrounding the discharge electrodes and the containers; and a chamber surrounding the electrode housing and having a window through which the extreme ultraviolet light passes out. The electrode housing may have an aperture through which the extreme ultraviolet light passes out; and a drain port configured to drain the melt of the waste material including the raw material leaking out of the containers and the melt of the debris adhering to inner walls of the electrode housing. The receiving plate member may be configured to be heated above the melting point of the waste material and the debris, and to be supported in an inclined attitude such that the melt of the waste material and the melt of the debris move down toward the storage vessel.

In this case, even if the storage vessel is located outside the chamber in the LDP scheme, it is possible to guide the melt of the waste material and the melt of the debris into the storage vessel while protecting the receiving surface of the receiving plate member from corrosion caused by the melt of the waste material and by the melt of the debris. This makes it possible to prevent corrosion of the receiving surface of the receiving plate member while making it possible to replace the storage vessel in which the waste material and the debris are stored.

The extreme ultraviolet light source apparatus may further include a pulse power supply configured to supply pulse electric power to the discharge electrodes; and an energy beam irradiator configured to irradiate the raw material in liquid phase adhering to an outer surface of one of the discharge electrodes with an energy beam when the discharge electrodes are rotated, thereby vaporizing the raw material.

In this case, the raw material capable of emitting extreme ultraviolet light is irradiated with an energy beam, such as a laser beam, to vaporize the raw material, and then a plasma is generated by the electric discharge.

In an embodiment, the light source part may include a disk-shaped raw material supply plate; a motor configured to rotate the raw material supply plate about a rotational shaft thereof; a container configured to store the raw material in liquid phase such that a portion of the raw material supply plate is immersed in the raw material; a raw-material-supply-plate housing surrounding the raw material supply plate and the container; and a chamber surrounding the raw-material-supply-plate housing and having a window through which the extreme ultraviolet light passes out. The raw-material-supply-plate housing may have an aperture through which the extreme ultraviolet light passes out; and a drain port configured to drain the melt of the waste material including the raw material leaking out of the container and the melt of the debris adhering to inner walls of the raw-material-supply-plate housing. The receiving plate member may be configured to be heated above the melting point of the waste material and the debris, and to be supported in an inclined attitude such that the melt of the waste material and the melt of the debris move down toward the storage vessel.

In this case, even if the storage vessel is located outside the chamber in the LPP scheme, it is possible to guide the melt of the waste material and the melt of the debris into the storage vessel while protecting the receiving surface of the receiving plate member from corrosion caused by the melt of the waste material and by the melt of the debris. This makes it possible to prevent corrosion of the receiving surface of the receiving plate member while making it possible to replace the storage vessel in which the waste material and the debris are stored.

The extreme ultraviolet light source apparatus may further include an energy beam irradiator configured to irradiate the raw material in liquid phase adhering to an outer surface of the raw material supply plate with an energy beam when the raw material supply plate is rotated, thereby plasmizing the raw material.

In this case, the raw material capable of emitting extreme ultraviolet light is irradiated with a laser beam, to excite the raw material for generating the plasma.

The extreme ultraviolet light source apparatus may further include a supporting member configured to support the receiving plate member in an inclined attitude such that the melt of the waste material and the melt of the debris move down toward the storage vessel. The supporting member may have a hollow space to make a lower edge of the supporting member in line contact with a surface that is disposed below the supporting member.

In this case, it is possible to prevent the melt of the waste material and the melt of the debris from going to the lower surface of the supporting member through the lower edge of the supporting member, and to prevent the melt of the raw material and the debris from leaking out to the periphery of the support member.

The extreme ultraviolet light source apparatus may further include a foil trap configured to trap particles of the debris emitted together with the extreme ultraviolet through the window; a heat shield panel configured to reduce heat radiation to the foil trap from the window; and a connection chamber connected to the chamber so as to surround the foil trap and the heat shield panel, and having a through-hole that communicates with the storage vessel. The melt of the waste material and the melt of the debris guided through the corrosion-resistant member on the receiving plate member, the melt of the debris trapped by the foil trap, and the melt of the debris adhered to the heat shield panel are stored into the storage vessel via the through-hole.

In this case, the melt of the waste material and the melt of the debris guided through the receiving plate member can be stored into the storage vessel, and the melt of the debris scattered in the connection chamber can also be stored into the storage vessel. Therefore, reduction in efficiency of the outgoing extreme ultraviolet light by the debris can be restricted while the size and complexity of the extreme ultraviolet light source apparatus are minimized.

The corrosion-resistant member may be a corrosion-resistant plate disposed on the receiving surface of the receiving plate member or a corrosion-resistant film that coats the receiving surface of the receiving plate member.

By using a corrosion-resistant plate as the corrosion-resistant member, the receiving surface of the receiving plate member can be protected without changing the configuration of the receiving plate member, and the corrosion-resistant plate can be easily replaced. On the other hand, by using a corrosion-resistant film as the corrosion-resistant member, the decrease in thermal conductivity from the receiving plate member can be limited, and the decrease in efficiency for heating the waste material and the debris above the melting point can be minimized.

The corrosion-resistant plate may have a lower end that protrudes from a lower end of the receiving plate member.

In this case, the melt of the waste material and the melt of the debris received by the corrosion-resistant plate are guided into the inside of the storage vessel without making the lower end of the receiving plate member protrude into the inside of the storage vessel. Therefore, while preventing the receiving plate member from being immersed in the melt of the waste material and the melt of the debris contained in the storage vessel, the melt of the waste material and the melt of the debris received by the receiving plate member can be prevented from overflowing into the surrounding area of the receiving plate member.

The lower end of the corrosion-resistant plate may be bent to extend along a direction in which the melt of the waste material and the melt of the debris fall.

This enables the guiding direction of the melt of the waste material and the melt of the debris by the corrosion-resistant plate at the lower end thereof to coincide with the falling direction of the melt of the waste material and the melt of the debris leaving the corrosion-resistant plate. Accordingly, the melt of the waste material and the melt of the debris guided through the corrosion-resistant plate can be efficiently stored into the storage vessel.

The lower end of the corrosion-resistant plate may be located above the storage vessel.

In this case, the melt of the waste material and the melt of the debris can be efficiently stored into the storage vessel since it is possible to prevent the melt of the waste material and the melt of the debris received by the corrosion-resistant plate from overflowing into the periphery of the through-hole.

The lower end of the corrosion-resistant plate may have a protrusion having a width gradually narrowing toward a lowermost edge thereof.

In this case, the melt of the waste material and the melt of the debris guided through the corrosion-resistant plate are gathered toward the lower end of the protrusion, and can easily leave the lower end of the protrusion. This makes it possible to efficiently store the melt of the waste material and the melt of the debris into the storage vessel since it is possible to prevent the melt of the waste material and the melt of the debris from overflowing into the surroundings from the protrusion of the corrosion-resistant plate.

The lower end of the corrosion-resistant plate may have an upper surface having a groove extending along a side edge of the lower end of the corrosion-resistant plate.

In this case, the groove receives the melt of the waste material and the melt of the debris that reaches the side edge of the lower end of the corrosion-resistant plate and guides them toward the lower end of the corrosion-resistant plate. Accordingly, even when the corrosion-resistant plate is made of a hard material, it is possible to reduce leakage of the melt of the waste material and the melt of the debris from the side edge of the lower end of the corrosion-resistant plate while avoiding a difficult process for the corrosion-resistant plate.

The corrosion-resistant plate may be formed of molybdenum or tungsten.

In this case, the corrosion-resistant plate is corrosion-resistant to the melt of the waste material and the melt of the debris, thereby preventing the receiving surface of the receiving plate member from being corroded.

In accordance with an aspect of the present invention, there is provided a method for protecting a receiving plate member that receives a melt of a waste material or a melt of debris, the waste material including the raw material emitting extreme ultraviolet light. The method includes disposing a corrosion-resistant member on a receiving surface of the receiving plate member, the corrosion-resistant member being more corrosion-resistant to the melt of the waste material or the melt of the debris than the receiving plate member, thereby protecting the receiving surface of the receiving plate member when the corrosion-resistant member receives the melt of the waste material or the melt of the debris.

In this aspect, it is possible to protect the receiving surface of the receiving plate member from corrosion caused by the melt of the waste material and by melt of the debris, while guiding the melt of the waste material or the melt of the debris into the storage vessel. Accordingly, the storage vessel can be located outside the chamber that encloses the light source part that emits the extreme ultraviolet light, while preventing corrosion of the receiving surface of the receiving plate member.

The corrosion-resistant member may be a corrosion-resistant plate disposed on the receiving surface of the receiving plate member, and the method may include receiving the melt of the waste material or the melt of the debris by the corrosion-resistant plate disposed on the receiving surface of the receiving plate member; and guiding the melt of the waste material or the melt of the debris into a storage vessel through the corrosion-resistant plate.

In this case, it is possible to protect the receiving surface of the receiving plate member without changing the configuration of the receiving plate member. In addition, it is possible to store the melt of the waste material or the melt of the debris into the storage vessel.

Effects of the Invention

In the aspect of the present invention, the corrosion resistance of the receiving surface of the receiving plate member that receives the waste material or debris can be improved.

DETAILED DESCRIPTION

Hereinafter, with reference to the accompanying drawings, embodiments of the present invention will be described in detail. The following embodiments are not intended to limit the present invention, and not all of the combinations of features described with reference to the embodiments are essential features of the present invention. The configurations of the embodiments may be modified or changed as appropriate depending on the specifications of the apparatus to which the present invention is applied and various requirements (conditions of use, the environment of usage, etc.). The technical scope of the invention is defined by the claims and is not limited by the following individual embodiments. The drawings used with reference to the following description may differ from the actual structure in scale and shape for ease of understanding each element.

Figure 1:
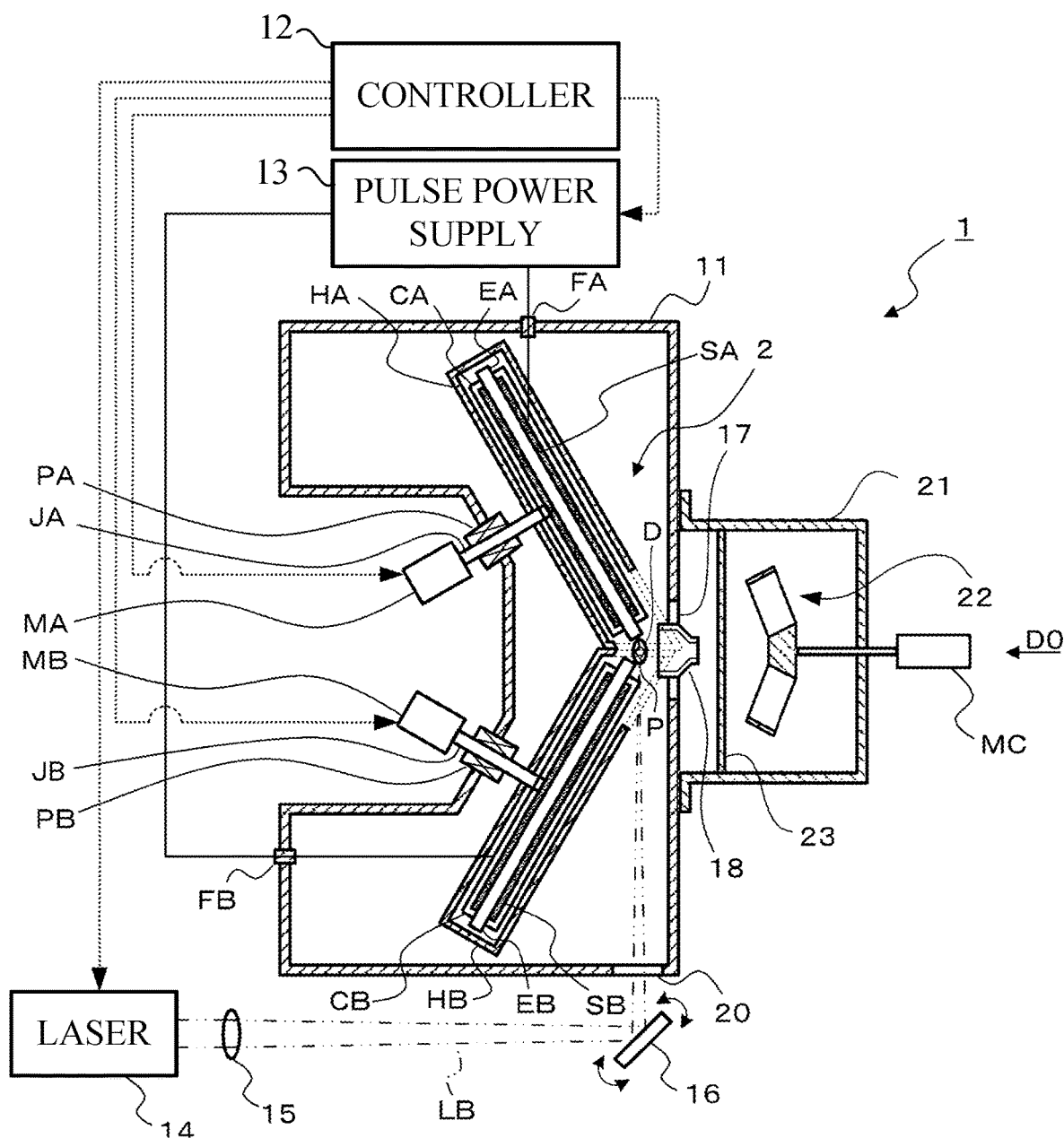
FIG. 1 is a cross-sectional view of an extreme ultraviolet light source apparatus according to a first embodiment, in which a chamber and a connection chamber are cutaway horizontally.
Figure 2:
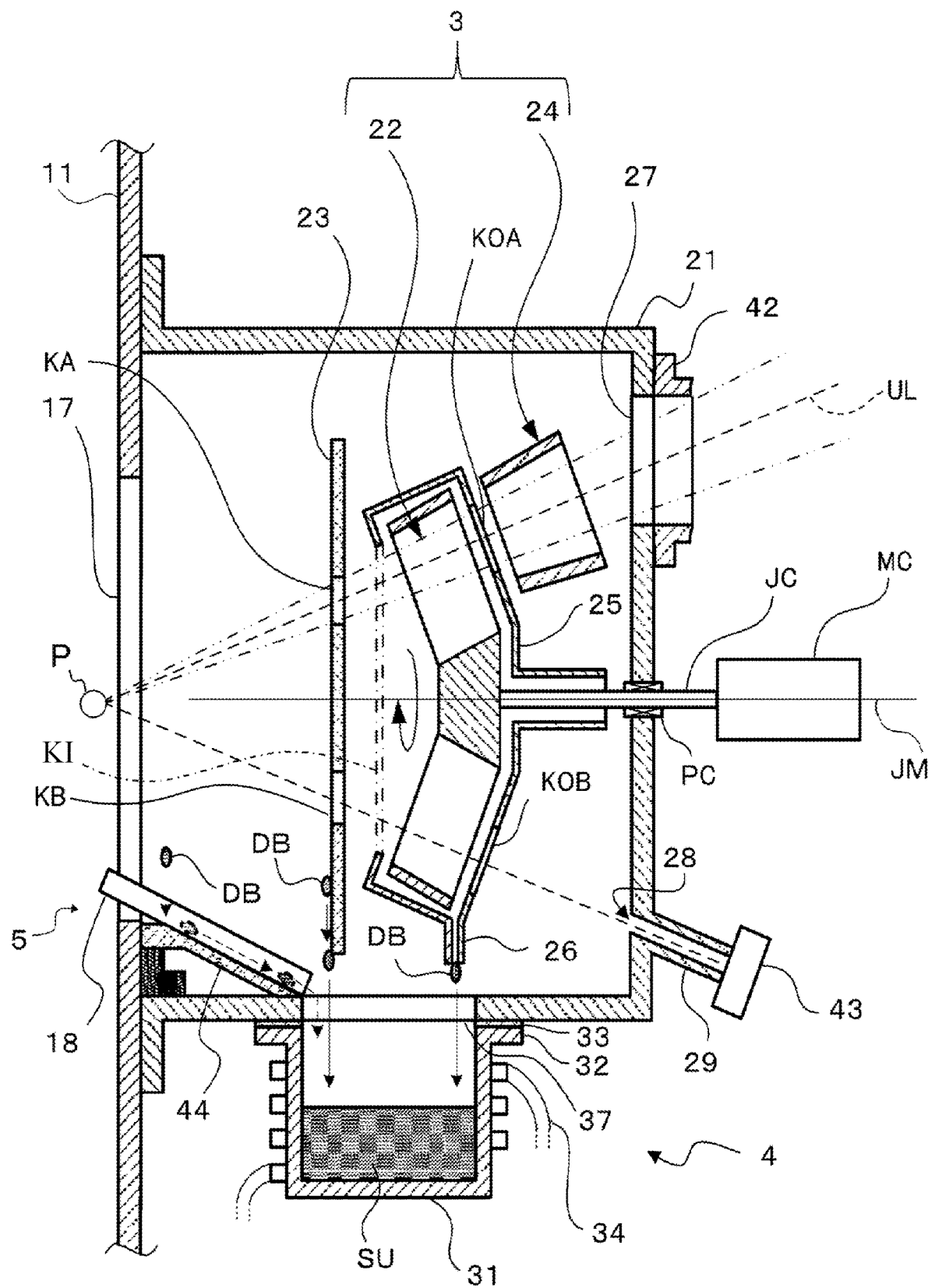
FIG. 2 is a cross-sectional view showing outline structures of a debris mitigation part and a debris storage part according to the first embodiment.
Figure 3:
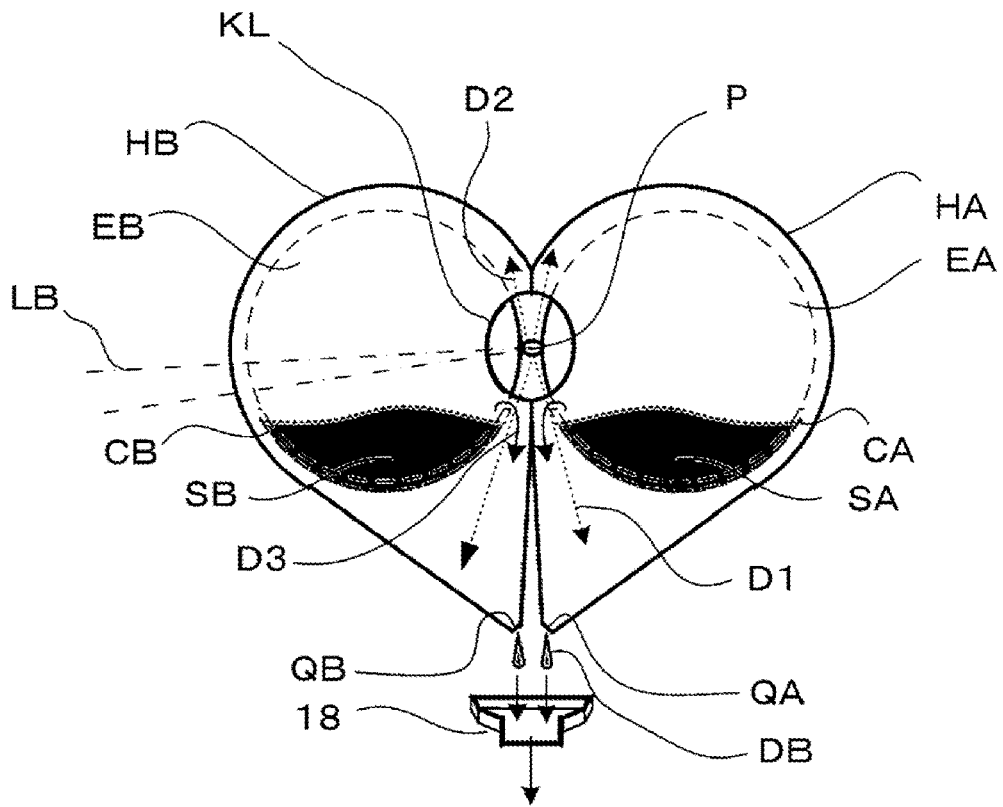
FIG. 3 is a side view of a light source part in the extreme ultraviolet light source apparatus viewed along line DO in FIG. 1.

FIG. 1 is a cross-sectional view of an extreme ultraviolet light source apparatus according to a first embodiment, in which a chamber and a connection chamber are cutaway horizontally. FIG. 2 is a cross-sectional view showing outline structures of a debris mitigation part and a debris storage part according to the first embodiment. FIG. 3 is a side view of a light source part in the extreme ultraviolet light source apparatus viewed along line DO in FIG. 1. The extreme ultraviolet light source apparatus (EUV light source apparatus) 1 according to the first embodiment is an EUV light source apparatus of the LDP type.

The EUV light source apparatus 1 in FIG. 1 emits extreme ultraviolet light (EUV light). The wavelength of the extreme ultraviolet light is, for example, 13.5 nm.

More specifically, the EUV light source apparatus uses an energy beam such as a laser beam LB to irradiate plasma raw materials SA and SB in liquid phase applied to the surfaces of a pair of electrodes EA and EB, which cause electric discharge, to vaporize the plasma raw materials SA and SB. Then, an electric discharge is generated in a discharge region D between the discharge electrodes EA and EB to generate a plasma P in the discharge region D. EUV light is emitted from the plasma.

The EUV light source apparatus 1 can be used, for example, as a light source apparatus of a lithography apparatus for manufacturing semiconductor devices or as a light source apparatus for an apparatus for inspecting masks used for lithography. For example, in a case in which the EUV light source apparatus 1 is used as a light source apparatus for a mask inspection apparatus, a portion of the EUV light emitted from the plasma P is guided to the mask inspection apparatus. The mask inspection apparatus uses the EUV light emitted from the EUV light source apparatus 1 as inspection light to perform mask blank inspection or mask pattern inspection. By using EUV light, the mask inspection apparatus can handle 5 to 7 nm processes. The EUV light introduced from the EUV light source apparatus 1 is defined by an aperture KA in a heat shield panel 23 shown in FIG. 2.

As shown in FIGS. 1 and 2, the EUV light source apparatus 1 includes a light source part 2, a debris mitigation part 3, a debris storage part 4, and a debris guiding part 5. The light source part 2 generates EUV light in accordance with the LDP scheme. The debris mitigation part 3 traps debris particles emitted from the light source part 2 along with the EUV light. The debris storage part 4 stores the debris generated by the light source part 2 and the debris trapped by the debris mitigation part 3. The debris guiding part 5 guides the melt of the plasma raw materials SA and SB and the particles of debris DB emitted from the plasma P to the debris storage part 4.

The EUV light source apparatus 1 also includes a chamber 11 that isolates the plasma P generated therein from the outside. The chamber 11 is formed of a rigid material, e.g., a metal. The chamber 11 is a vacuum housing, and the interior thereof is kept in a depressurized atmosphere in order to generate a good discharge for heating and exciting the plasma raw materials SA and SB and to restrict attenuation of the EUV light generated by the discharge.

The light source part 2 is located within the chamber 11. The light source part 2 includes a pair of discharge electrodes EA and EB. The discharge electrodes EA and EB are disc members of the same shape and the same size. For example, the discharge electrode EA is used as a cathode whereas the discharge electrode EB is used as an anode. The discharge electrodes EA and EB are formed of, for example, a high-melting-point metal such as tungsten, molybdenum, or tantalum. The discharge electrodes EA and EB are disposed at positions spaced apart from each other, but the peripheral portions of the discharge electrodes EA and EB are close to each other. The discharge region D, in which plasma P is generated, is located in the gap between the discharge electrodes EA and EB, in which the peripheral portion of the discharge electrode EA and the peripheral portion of the discharge electrode EB are closest to each other.

A pulse power supply 13 supplies electric power to the discharge electrodes EA and EB to cause an electric discharge in the discharge region D. The plasma raw materials SA and SB transported to the discharge region D by rotation of each of the discharge electrodes EA and EB are heated and excited by the current flowing between the discharge electrodes EA and EB during the discharge, so that plasma P, which emits EUV light, is generated.

The discharge electrode EA is connected to the rotational shaft JA of a motor MA and rotates about the axis of the discharge electrode EA. The discharge electrode EB is connected to the rotational shaft JB of a motor MB and rotates about the axis of the discharge electrode EB. The motors MA and MB are located outside the chamber 11, and the rotational shafts JA and JB of the motors MA and MB extend from the outside of the chamber 11 to the inside of the chamber 11. The gap between the rotational shaft JA and the wall of the chamber 11 is sealed with a sealing member PA, and the gap between the rotational shaft JB and the wall of the chamber 11 is also sealed with a sealing member PB. The sealing members PA and PB are, for example, mechanical seals. The sealing members PA and PB rotatably support the rotational shafts JA and JB while maintaining a reduced-pressure atmosphere in the chamber 11.

Thus, the discharge electrodes EA and EB are respectively driven by separate motors MA and MB. The rotation of each of the motors MA and MB is controlled by a controller 12.

A container CA for storing the liquid-phase plasma raw material SA and a container CB for storing the liquid-phase plasma raw material SB are disposed inside the chamber 11. The heated liquid-phase plasma raw materials SA and SB are supplied to the containers CA and CB. The liquid-phase plasma raw materials SA and SB are, for example, tin.

A lower part of the discharge electrode EA is immersed in the plasma raw material SA in the container CA, and a lower part of the discharge electrode EB is immersed in the plasma raw material SB in the container CB. As a result, the liquid-phase plasma raw materials SA and SB adhere to the lower parts of the discharge electrodes EA and EB. As the discharge electrodes EA and EB rotate, the liquid-phase plasma raw materials SA and SB are transported to the discharge region D at which the plasma P is to be generated.

There is placed outside the chamber 11 a laser (energy beam irradiation device) 14 that irradiates the plasma raw material SA on the discharge electrode EA transported to the discharge region D with an energy beam to vaporize the plasma raw material SA. The laser 14 is, for example, Nd:YVO$_4$ laser (Neodymium-doped Yttrium Orthovanadate laser), and emits an infrared laser beam LB having a wavelength of 1064 nm. However, the energy beam irradiation device may be another device that emits an energy beam other than a laser beam LB capable of vaporizing the plasma raw material SA.

Illumination timing of the laser beam LB by the laser 14 is controlled by the controller 12. The laser beam LB emitted from the laser 14 is directed to a movable mirror 16 through, e.g., a light-collecting means that includes a condensing lens 15. The light-collecting means adjusts the spot diameter of the laser beam LB at the laser beam irradiation position on the discharge electrode EA. The condensing lens 15 and the movable mirror 16 are located outside the chamber 11.

The laser beam LB focused by the condensing lens 15 is reflected by the movable mirror 16, passes through a transparent window 20 in the wall of the chamber 11, and illuminates the outer peripheral portion of the discharge electrode EA in the vicinity of the discharge region D.

The position in the discharge electrode EA irradiated with the laser beam LB is adjusted by adjusting the attitude of the movable mirror 16. The attitude of the movable mirror 16 may be adjusted manually by an operator, or the controller 12 may control the attitude of the movable mirror 16 based on intensity information on the EUV light supplied from a monitoring device 43, which will be described later. In the latter case, the movable mirror 16 is driven by a movable mirror driver, of which the illustration is omitted.

To facilitate irradiation on the outer peripheral portion of the electrode EA in the vicinity of the discharge region D with the laser beam LB, the axes of the discharge electrodes EA and EB are not parallel. The interval between the rotational shafts JA and JB is narrower on the side of the motors MA and MB and is wider on the side of the discharge electrodes EA and EB. As a result, whereas the near sides of the discharge electrodes EA and EB are brought closer to each other, the remote sides of the discharge electrodes EA and EB can be retracted behind the irradiation path of the laser beam LB, and the peripheral portion of the discharge electrode EA near the discharge region D can be easily irradiated with the laser beam LB.

The discharge electrode EB is located between the discharge electrode EA and the movable mirror 16. The laser beam LB reflected by the movable mirror 16 passes through the vicinity of the outer peripheral surface of the discharge electrode EB, and then reaches the outer peripheral surface of the discharge electrode EA. The discharge electrode EB is retracted behind the discharge electrode EA toward the motor MB (the left side of FIG. 1) so as not to interfere with traveling of the infrared laser beam LB.

The liquid-phase plasma raw material SA on the outer peripheral surface of the discharge electrode EA in the vicinity of the discharge region D is vaporized by irradiation with the laser beam LB, and a gas-phase plasma raw material SA is supplied to the discharge region D.

To generate the plasma P in the discharge region D (to plasmize the plasma raw material SA in gas phase), the pulse power supply 13 supplies electric power to the discharge electrodes EA and EB. When the gas-phase plasma raw material SA is supplied to the discharge region D by the irradiation of the laser beam LB, an electric discharge occurs in the discharge region D between the discharge electrodes EA and EB. The pulse power supply 13 periodically supplies pulsed electric power to the discharge electrodes EA and EB.

The pulse power supply 13 is located outside the chamber 11. Electric supply lines extending from the pulse power supply 13 pass through feedthroughs FA and FB and extend into the interior of the chamber 11. The feedthroughs FA and FB are sealing members that are embedded in the wall of the chamber 11 to maintain a reduced-pressure atmosphere within the chamber 11. The operations of the laser 14 and the pulse power supply 13 for generating the plasma P are controlled by the controller 12.

The two electric supply lines extending from the pulse power supply 13 pass through the feedthroughs FA and FB and are connected to the containers CA and CB, respectively. The containers CA and CB are made of an electrically conductive material, and the plasma raw materials SA and SB inside the containers CA and CB are also an electrically conductive material, e.g., tin. The lower portions of the discharge electrodes EA and EB are immersed in the plasma raw materials SA and SB inside the containers CA and CB. Thus, when the pulse power supply 13 supplies pulsed electric power to the containers CA and CB, the pulsed electric power is consequently supplied to the discharge electrodes EA and EB through the plasma raw materials SA and SB. When discharge occurs between the discharge electrodes EA and EB, the plasma raw material SA in gas phase in the discharge region D is heated and excited by the current, so that the plasma P is generated.

EUV light is emitted from the plasma P. The EUV light is used in a utilizing apparatus, which is another optical apparatus (a lithography apparatus or an inspection apparatus for masks). In this embodiment, the EUV light is used in a mask inspection apparatus.

A connection chamber 21 is located between the chamber 11 and the utilizing apparatus. The connection chamber 21 is formed of a rigid material, e.g., a metal. The connection chamber 21 is a vacuum housing, and the interior thereof is kept in a depressurized atmosphere to restrict attenuation of the EUV light in a manner similar to the interior of the chamber 11.

The interior space of the connection chamber 21 is connected to (communicates with) the chamber 11 through a window 17, which is a through-hole formed in the wall of the chamber 11. The interior space of the connection chamber 21 is also connected to (communicates with) the utilizing apparatus (mask inspection apparatus) 42 through a window 27, which is a through-hole formed in the wall of the connection chamber 21. In FIG. 2, only part of the utilizing apparatus 42 is shown. The EUV light emitted from the plasma P in the discharge region D is introduced into the utilizing apparatus (mask inspection apparatus) 42 through the windows 17 and 27.

On the other hand, particles of debris DB are emitted from the plasma P at high speeds in various directions along with the EUV light. The particles of debris DB include tin particles, which include vaporized plasma raw materials SA and SB and material particles of the discharge electrodes 21a and 21b sputtered by generation of the plasma P. The particles of debris DB gain large kinetic energy by contraction and expansion of the plasma P.

In order to trap the particles of debris DB, a debris mitigation part 3 is provided in the connection chamber 21. At least some of the particles of debris DB emitted toward the connection chamber 21 are trapped by the debris mitigation part 3. However, debris particles DB that travel in other directions will be likely to adhere to the interior of the EUV light source apparatus 1 (e.g., the inner wall of the chamber 11), causing inside contamination if a countermeasure is not implemented.

To prevent the inside contamination caused by scattering of the particles of debris DB as much as possible, as shown in FIG. 1, the discharge electrode EA, the container CA, and part of the rotational shaft JA are surrounded by an electrode housing HA, and the discharge electrode EB, the container CB, and part of the rotational shaft JB are surrounded by an electrode housing HB. The rotational shafts JA and JB are connected to the discharge electrodes EA and EB, respectively, through, for example, holes formed in the electrode housings HA and HB (not shown). The electrode housings HA and HB are arranged in the chamber 11 so as to be adjacent to each other.

As shown in FIG. 3, the electrode housings HA and HB are provided with an EUV light outlet aperture KL so that the EUV light emitted from the plasma P is directed to the utilizing apparatus 42 through the connection chamber 21. The EUV light outlet aperture KL is also used for an inlet for the energy beam that irradiates the plasma raw material SA that is adhered to the discharge electrode EA and is transported to the discharge region D. In the lowermost portions of the electrode housings HA and HB, there are provided drain ports QA and QB for draining the debris DB and the waste material that adhered to the inner surfaces of the electrode housings HA and HB to the outside.

Most of the debris particles DB that may adhere to the interior of the EUV light source apparatus 1 are emitted in debris scattering directions D1 and D2 and are captured in the electrode housings HA and HB. In addition, only a small amount of the plasma raw material SA adhered to the discharge electrodes EA and transported to the discharge region D is vaporized by irradiation of the energy beam for plasma generation. Therefore, most of the plasma raw material SA adhered to the discharge electrode EA is returned to the container CA without being used, and some of it falls by the force of gravity and is captured in the electrode housing HA instead of returning to the container CA. Furthermore, for some problem, some of the liquid-phase plasma raw materials SA and SB stored in the containers CA and CB may overflow from the containers CA and CB. The overflowing plasma raw materials SA and SB leak out in material leakage directions D3 and are captured as waste materials in the electrode housings HA and HB.

Since the electrode housings HA and HB are located near the plasma P, they are heated above the melting point of the debris DB and the waste materials by EUV radiation from the plasma P. In this specification, the melting point is referred to as the melting point of the plasma raw materials SA and SB such as tin. Thus, in a case in which the discharge electrodes EA and EB are formed of, for example, a high-melting-point metal such as tungsten, molybdenum, or tantalum, the melting point of the debris DB is not influenced by the melting point of the discharge electrodes EA and EB even when the particles of debris DB contain particles of the material of the discharge electrodes EA and EB. Accordingly, tin contained in the debris DB and the waste material adhering to the inner surfaces of the electrode housings HA and HB remains in liquid phase without solidification. The debris DB and the waste material that adhered to the inner surfaces of the electrode housings HA and HB gather in the lowermost portions of the electrode housings HA and HB by the force of gravity, and are drained from the drain ports QA and QB to the outside, thereby falling in the vertical direction.

The debris DB and the waste material that fall in the vertical direction from the drain ports QA and QB are received by a receiving plate member 18. As shown in FIG. 2, the receiving plate member 18 is supported by a supporting stage 44 disposed in the connection chamber 21. The supporting stage 44 supports the receiving plate member 18 in an inclined attitude. The supporting stage 44 is inclined so that the debris DB and the waste material drained from a drain portion of the receiving plate member 18 are stored in a debris storage vessel, which is a waste material dump (tin dump) located below the connection chamber 21 (lower side in FIG. 2). The receiving plate member 18 is heated by heating means, so that the temperature thereof is maintained above the melting point of tin. Therefore, the debris DB and the waste material that fell onto the receiving plate member 18 from the drain ports QA and QB are in liquid phase and move along a receiving surface of the inclined receiving plate member 18 to the drain portion of the receiving plate member 18.

On the other hand, the particles of debris DB are emitted from the plasma P at high speeds in various directions. The particles of debris DB generated from the plasma P contain fast-moving ions, neutral atoms, and electrons. When the particles of debris DB reach the utilizing apparatus 42, they may damage or contaminate reflective films of optical elements in the utilizing apparatus 42 and may degrade its performance. Accordingly, the debris mitigation part 3 traps the particles of debris DB so that the particles of debris DB do not ingress into the utilizing apparatus 42. The debris mitigation part 3 includes a stationary foil trap 24 that has a plurality of stationary foils and a rotating foil trap 22 that has a plurality of foils that actively collide with the debris particles. The stationary foil trap 24 is disposed between the rotating foil trap 22 and the utilizing apparatus 24 in the course of the optical path of the EUV light that travels from the connection chamber 22 to the utilizing apparatus (mask inspection apparatus) 42.

Figure 4:
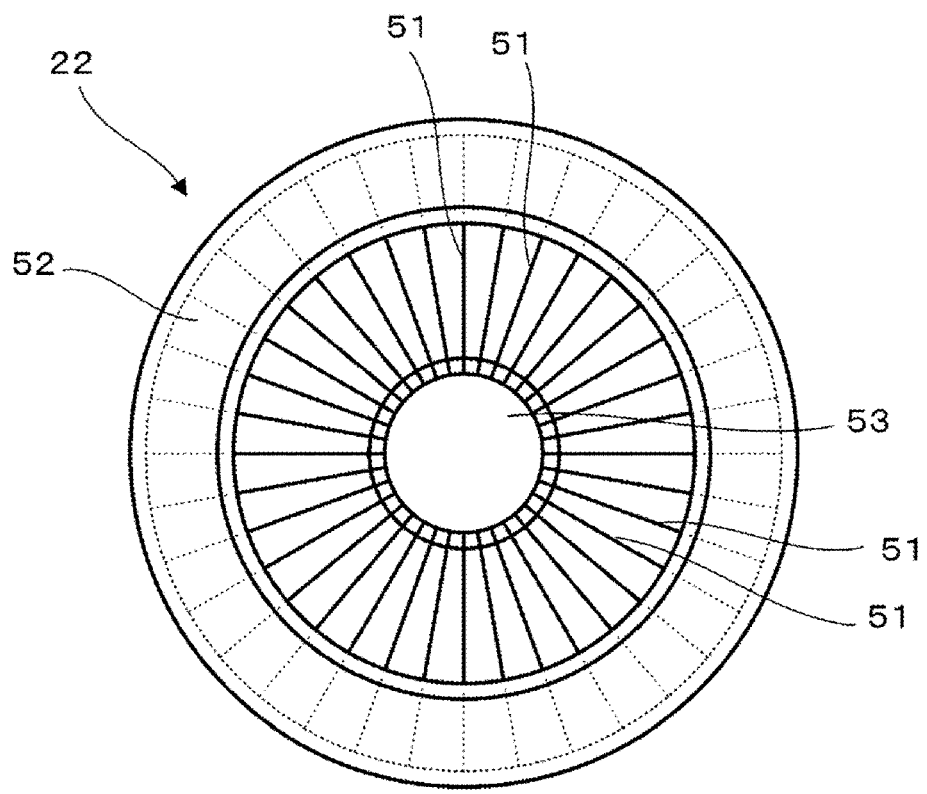
FIG. 4 is a front view of an example of a rotating foil trap shown in FIG. 2.

FIG. 4 is a front view of an example of the rotating foil trap shown in FIG. 2.

As shown in FIG. 4, the rotating foil trap 22 has a central hub 53, an outer ring 52 that is concentric to the hub 53, and a large number of foils 51 disposed between the hub 53 and the outer ring 52. Each foil 51 is a thin film or a thin flat plate. The foils 51 are arranged radially with substantially equal angular intervals. Each foil 51 lies in a plane containing the central axis of the hub 53. The material for the rotating foil trap 22 is a high-melting-point metal such as tungsten and/or molybdenum.

The multiple foils 51 of the rotating foil trap 22 are arranged parallel to the ray direction of the EUV light traveling toward the window 27 so as not to block the EUV light traveling from the plasma P (light emission point) toward the window 27. In other words, for the rotating foil trap 22 in which each foil 51 is arranged on a plane including the central axis of the hub 53 as shown in FIG. 2, the plasma P is arranged on an extension of the central axis of the hub 53. In this case, the ratio (also called transmittance) of the EUV light that can pass through the rotating foil trap 22 can be maximized since the EUV light is shielded only by the thickness of each foil 51 between the hub 53 and the outer ring 52.

The hub 53 is connected to or coupled with the rotational shaft JC of a motor (rotation drive device) MC, and the central axis of the hub 53 is aligned with the central axis of the rotational shaft JC. The rotation shaft JC of the motor MC can be regarded as the rotational shaft of the rotating foil trap 22. Driven by the motor MC, the rotating foil trap 22 rotates, and the rotating foils 51 collide with the particles of debris DB arriving from the plasma P and trap them for preventing them from entering the utilizing apparatus 40.

Whereas the rotating foil trap 22 is located inside the connection chamber 21, the motor MC is located outside the connection chamber 21. A through-hole is formed in the wall of the connection chamber 21, and the rotational shaft JC passes through the through-hole. The gap between the rotational shaft JC and the wall of the connection chamber 21 is sealed with a sealing member PC having a mechanical seal. The sealing member PC allows rotation of the rotational shaft JC of the motor MC while maintaining a reduced-pressure atmosphere in the connection chamber 21.

To reduce heat radiation from the plasma P to the rotating foil trap 22 and prevent overheating thereof, a heat shield panel 23 is disposed within the connection chamber 21. The heat shield panel 23 has an aperture KA through which part of the EUV light emitted from the plasma P passes out. The aperture KA may have an arbitrary shape (e.g., circle). Since the heat shield panel 23 is located near the plasma P, it is made of a high-melting-point material such as molybdenum or tungsten.

The aperture KA is located at a position eccentric from the rotational shaft JC of the rotating foil trap 22. Accordingly, part of the EUV light emitted from the plasma P travels through the aperture KA of the heat shield panel 23 at a predetermined three-dimensional angle relative to the direction of the rotational shaft of the rotating foil trap 22 (lateral direction in FIG. 2).

The rotating foil trap 22 is arranged such that each rotating foil 51 can be aligned with the main ray UL of the EUV light beam that passed through the aperture KA of the heat shield panel 23 (hereinafter referred to as EUV outgoing light). The EUV light ongoing from the aperture KA of the heat shield panel 23 passes through the debris mitigation part 3 and is introduced into the utilizing apparatus (mask inspection apparatus) 42 through the window 27.

The rotating foil trap 22 traps relatively slow particles of debris DB among the particles of debris DB emitted from the plasma P, whereas the stationary foil trap 24 traps faster particles of debris DB that could not be trapped by the rotating foil trap 22. As shown in FIG. 2, the stationary foil trap 24 is disposed on the main ray UL of the EUV outgoing light.

The stationary foil trap 24 has a shape corresponding to the area through which the EUV outgoing light, which is the EUV light of which the direction of travel is restricted by the aperture KA of the heat shield panel 23, passes.

Figure 5:
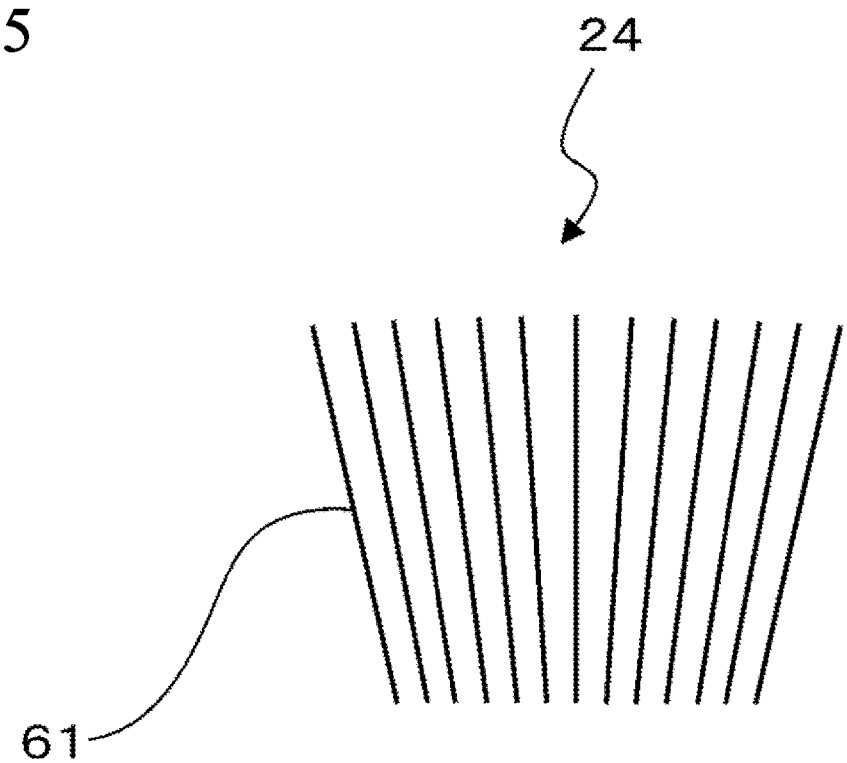
FIG. 5 is a top cross-sectional view of an example of a stationary foil trap shown in FIG. 2.
Figure 6:
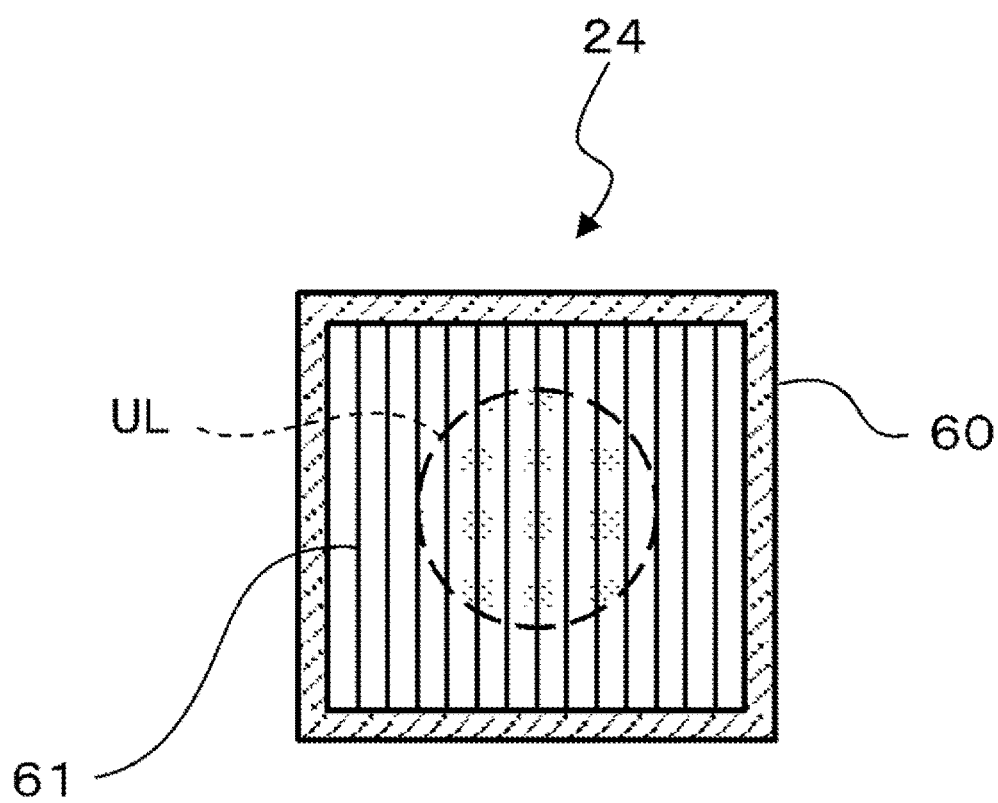
FIG. 6 is a front view of the example of the stationary foil trap shown in FIG. 2.

FIG. 5 is a top cross-sectional view of an example of the stationary foil trap shown in FIG. 2, and FIG. 6 is a front view of the example of the stationary foil trap shown in FIG. 2.

As shown in FIGS. 5 and 6, the stationary foil trap 24 has a plurality of foils 61 and a stationary frame (stationary member) 60 that supports the foils 61.

As shown in FIG. 6, the foils 61 are arranged at equal intervals in a cross-section that is perpendicular to the direction of the main ray UL of the EUV outgoing light. The stationary frame 60 is, for example, rectangular in shape viewed from the front. However, the contour of the stationary frame 60 may have any desired shape. As shown in FIG. 5, the multiple foils 61 are arranged radially so that they extend along directions of the rays in the EUV outgoing light when viewed from a direction that is perpendicular to the direction of the main ray UL of the EUV outgoing light.

The multiple foils 61 of the stationary foil trap 24 divide a space in which the stationary foil trap 24 is disposed, and reduces the conductance in the divided sections to increase the pressure locally. By supplying a gas to the stationary foil trap 24 as needed, the pressure in the stationary foil trap 24 can be increased. In other words, in the connection chamber 21, the gas is localized in the stationary foil trap 24 to set up a portion in which pressure is relatively high. The gas supplied to the stationary foil trap 24 is preferably a gas that has high transmittance for EUV light, for example, a noble gas such as helium (He) or argon (Ar), or hydrogen ($H_2$).

High velocity particles of debris DB that cannot be trapped in the rotating foil trap 22 are decelerated because of the increased probability of collision with the gas in the area of increased pressure in the stationary foil trap 24. The collision with the gas also deflects the directions of travel of the particles of debris DB. The stationary foil trap 24 traps the decelerated and deflected particles of debris DB by the foils 61 and/or the stationary frame 60.

A cover member 25 is located in the connection chamber 21. The cover member 25 surrounds the rotating foil trap 22 and prevents the particles of debris DB trapped by the rotating foil trap 22 from being scattered to the interior of the connection chamber 21. The cover member 25 has an inlet side opening KI and outlet side openings KOA and KOB. The inlet side opening KI is located at a position at which the EUV light entering the rotating foil trap 22 is not shielded. The outlet side opening KOA is located at a position at which the EUV light entering the stationary foil trap 24 is not shielded after passing through the inlet side opening KI and the rotating foil trap 22. The outlet side opening KOB is located at a position at which the EUV light entering a monitoring device 43 is not shielded after passing through the inlet side opening KI and the rotating foil trap 22.

At least some of the particles of debris DB trapped by the rotating foil trap 22 move radially on the foils 51 of the rotating foil trap 22 by centrifugal force, separate from edges of the foils 51, and adhere to inner surfaces of the cover member 25.

The cover member 25 is heated by heating means (not shown) and/or by secondary thermal radiation from the heat shield panel 23, which has been heated by EUV radiation, so that the debris DB adhering to the inner surfaces of the cover member 25 remains in liquid phase without solidification. The debris DB adhering to the inner surfaces of the cover member 25 gathers in the lowermost portion of the cover member 25 by the force of gravity, and is drained from the lowermost portion of the cover member 25 through a drain pipe 26 to the outside of the cover member 25 as a waste material. Then, the waste material is stored in the debris storage part 4. Thus, the cover member 25 prevents the debris DB that leaves the edges of the foils 51 of the rotating foil trap 22 from scattering to the interior of the connection chamber 21.

The debris storage part 4 includes a debris storage vessel 31. The debris storage vessel 31 is located outside the connection chamber 21 and is attached to the connection chamber 21. The debris storage vessel 31 stores a storage object SU that includes the debris DB and other waste materials.

A through-hole 37 is formed in the bottom wall of the connection chamber 21 to connect the interior space of the debris storage vessel 31 with the interior space of the connection chamber 21. The debris storage vessel 31 has a flange 32 at the top thereof. The opening of the debris storage vessel 31 surrounded by the flange 32 is aligned with the through-hole 37. The flange 32 is fixed to the bottom wall of the connection chamber 21 with, for example, screws, so that the debris storage vessel 31 is attached to the connection chamber 21. The gap between the flange 32 and the bottom wall of the connection chamber 21 is sealed with a gasket 33. The heat shield panel 23 is positioned above the through-hole 37 and is oriented in an upright position. The outlet of the drain pipe 26 is positioned above the through-hole 37. The debris storage vessel 31 is located at a position into which the debris DB falls from the heat shield panel 23 and the drain pipe 26.

The waste material drained out of the cover member 25 through the drain pipe 26 falls in the vertical direction and is accumulated in the debris storage vessel 31, which is located below the connection chamber 21 (lower side in FIG. 2). On the other hand, some of the particles of debris DB emitted from the plasma P in various directions enter the connection chamber 21 through the window 17 of the chamber 11 and are deposited on the surface of the heat shield panel 23 that faces the window 17. The particles of debris DB deposited on the heat shield panel 23 are melted by the heat radiation from the plasma P, and when they reach a certain amount, they become droplets and move downward on the heat shield panel 23 by the force of gravity. The melted debris DB that has moved to the lowermost portion of the heat shield panel 23 leaves the heat shield panel 23 and falls below the connection chamber 21, so as to be stored in the debris storage vessel 31.

Thus, the heat shield panel 23 not only limits EUV radiation from the plasma P to the rotating foil trap 22 to prevent overheating of the rotating foil trap 22 and to enable some of the EUV light emitted from the plasma P to pass through the aperture KA, but also reduces the amount of the particles of debris DB traveling toward the rotating foil trap 22 as much as possible for mitigating the load on the rotating foil trap 22.

Since most of the particles of debris DB are tin and the waste material is also tin, the debris storage vessel 31 may be called a tin recovery container. A heater wire 34 that heats the debris storage vessel 31 is wrapped around the debris storage vessel 31 as heating means for the debris storage vessel 31. However, heating means may be embedded in the debris storage vessel 31.

During the period of use of the EUV light source apparatus 1, the interior of the debris storage vessel 31 is heated by the heater wire 34 at a temperature not less than the melting point of tin (about 232 degrees Celsius), and tin accumulated within the debris storage vessel 31 is turned into a liquid phase.

The reason for turning tin inside the debris storage vessel 31 into liquid is that when tin in the debris DB accumulated in the debris storage vessel 31 solidifies, the accumulated mass grows like stalagmites in a stalactite cave on one or more positions into which the particles of debris DB are likely to fall. If the accumulation of debris DB grows into a stalagmite shape, the drain pipe 26 of the cover member 25 may be closed with the debris DB, and the debris DB may accumulate in the cover member 25. In addition, at least part of the accumulation of the debris DB in the cover member 25 may be in contact with the rotating foil trap 22, preventing the rotation of the rotating foil trap 22 or damaging the rotating foil trap 22.

Alternatively, part of the outlet side openings KOA and KOB of the cover member 25 may be closed with the debris DB accumulated in the cover member 25, and part of the EUV light intended to pass through the outlet side openings KOA and KOB may be blocked.

By turning tin stored inside the debris storage vessel 31 into a liquid phase, the top of accumulated tin inside the debris storage vessel 31 is flattened, allowing for storage of tin in the debris storage vessel 31 while avoiding stalagmite-like growth of tin.

When recovering tin accumulated in the debris storage vessel 31, the power supply to the heater wire 34 is stopped, so that heating the inside of the debris storage vessel 31 is stopped. Then, after the temperature of the debris storage vessel 31 returns to room temperature and tin stored in the debris storage vessel 31 is solidified, the interior pressure of the connection chamber 21 is returned to the atmospheric pressure. Then, the debris storage vessel 31 is removed from the connection chamber 21, and a new debris storage vessel 31 without tin is mounted on the connection chamber 21.

Although tin inside the debris storage vessel 31 removed from the connection chamber 21 is in a solid phase, tin can be taken out from the debris storage vessel 31 by reheating the debris storage vessel 31 to liquidize tin therein again. After tin is taken out from the debris storage vessel 31, which removed from the connection chamber 21, is the debris storage vessel 31 can be reused.

Furthermore, a monitoring device 43 for monitoring the EUV light is located outside the connection chamber 42. The monitoring device 43 is a detector that detects the presence of EUV light or a measuring device that measures the intensity of EUV light.

An EUV-light guiding hole 28 that is a through-hole allowing the EUV light to pass is formed in the wall of the connection chamber 21, and a guiding tube 29 is disposed between the EUV-light guiding hole 28 and the monitoring device 43, and the EUV light passes through the guiding tube 29 without leaking out of the connection chamber 21.

In the heat shield panel 23, an aperture KB through which part of the EUV light from the plasma P can pass out is formed at a different position from the aperture KA. The aperture KB may have an arbitrary shape (e.g., circle).

The monitoring device 43, the EUV-light guiding hole 28, and the guiding tube 29 are aligned with an extension of a straight line connecting the plasma P and the center of the aperture KB. Therefore, part of the EUV light emitted from the plasma P reaches the monitoring device 43 through the window 17 of the chamber 11, the aperture KB of the heat shield panel 23, the inlet side opening KI of the cover member 25, the clearances between the multiple foils 51 of the rotating foil trap 22, the outlet side opening KOB of the cover member 25, the EUV-light guiding hole 28 in the wall of the connection chamber 21, and the lumen of the guiding tube 29. In this way, the EUV light can be monitored by the monitoring device 43.

Figure 7:
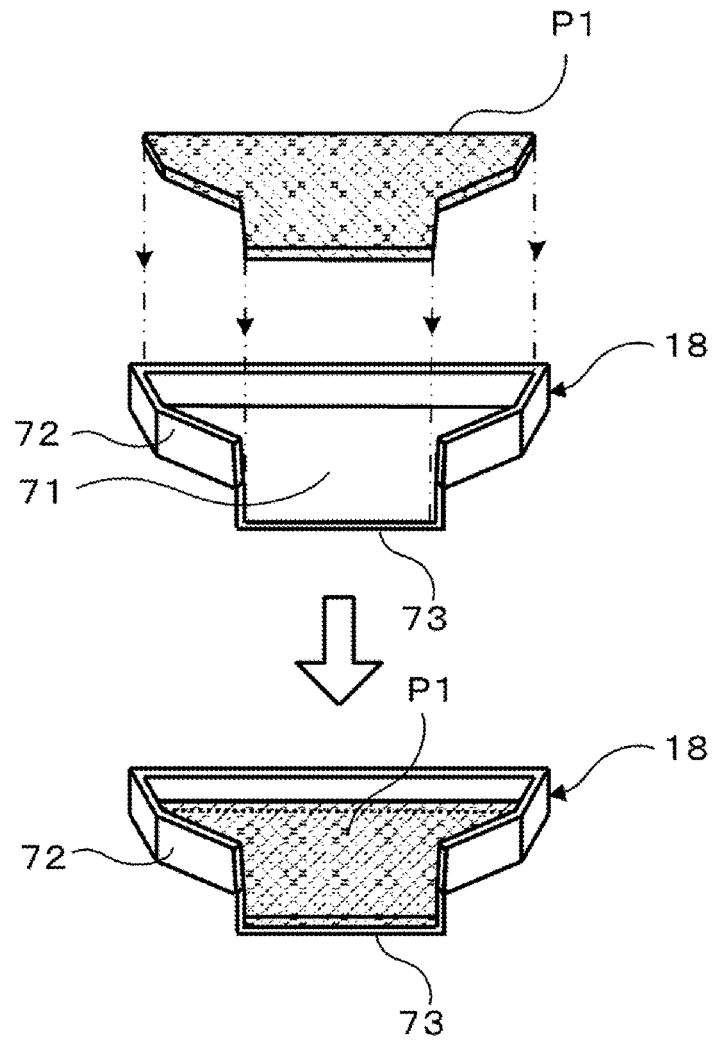
FIG. 7 is a perspective view showing how to mount a corrosion-resistant plate on a receiving plate member shown in FIG. 2.
Figure 8:
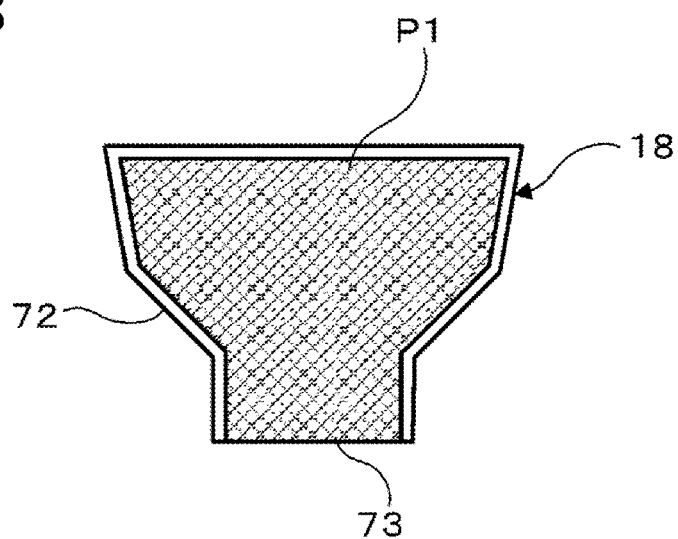
FIG. 8 is a plan view showing an example of the receiving plate member on which the corrosion-resistant plate in FIG. 7 is mounted.
Figure 9:
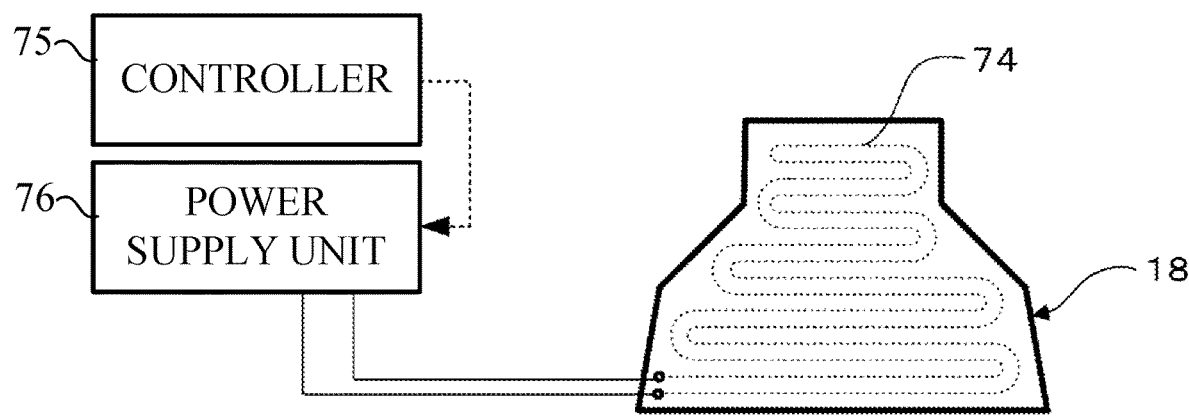
FIG. 9 is a back view showing an example of the receiving plate member shown in FIG. 8.

FIG. 7 is a perspective view showing how to mount a corrosion-resistant plate on the receiving plate member shown in FIG. 2. FIG. 8 is a plan view showing an example of the receiving plate member on which the corrosion-resistant plate in FIG. 7 is mounted. FIG. 9 is a back view showing an example of the receiving plate member shown in FIG. 8.

As shown in FIG. 9, the debris guiding part 5 of FIG. 2 includes the receiving plate member 18, a controller 75, and a power supply unit 76. The receiving plate member 18 has a receiving surface 71, a drain portion 73, and a peripheral wall portion 72. The receiving surface 71 receives the droplets of debris DB and waste material. The drain portion 73 discharges the droplets of debris DB and waste material received by the receiving surface 71. The receiving surface 71 has a width that is narrower on the side of the drain portion 73 (front side of the receiving plate member 18) than on the side of the discharge electrodes EA and EB (rear side of the receiving plate member 18). The peripheral wall portion 72 is a wall surrounding the periphery of the receiving surface 71 excluding the drain portion 73. The peripheral wall portion 72 restrains the liquid of the debris DB and the waste material received at the receiving surface 71 from overflowing from the receiving plate member 18 other than the drain portion 73. The receiving plate member 18 is formed of, for example, stainless steel because of heat resistance, workability, and economy.

Heating means 74 for heating the receiving surface 71 is embedded beneath the receiving surface 71 of the receiving plate member 18. The controller 75 controls the power supply unit 76 to supply electric power to the heating means 74 to maintain the temperature of the receiving plate member 18 above the melting point of the debris DB and the waste material on the basis of temperature information from temperature measuring means (not shown) that measures the temperature of the receiving plate member 18. The power supply unit 76 supplies electric power for heating the heating means 74.

A corrosion-resistant plate P1 is disposed on the receiving surface 71 of the receiving plate member 18. The corrosion-resistant plate P1 has higher corrosion resistance to liquid of the debris DB and the waste material than the receiving plate member 18. It is preferable that the material for the corrosion-resistant plate P1 not only have excellent corrosion resistance, but also have good heat resistance. For example, the material for the corrosion-resistant plate P1 may be molybdenum or tungsten. The contour of the corrosion-resistant plate P1 can match the contour of the receiving surface 71. To increase the contact area of the corrosion-resistant plate P1 and the receiving surface 71 and for facilitating heat transfer from the receiving plate member 18 to the corrosion-resistant plate P1, the facing surfaces of the corrosion-resistant plate P1 and the receiving surface 71 can be made flat. At least part of the facing surfaces (contact surfaces) of the corrosion-resistant plate P1 and the receiving surface 71 may be polished.

The receiving plate member 18 is provided so that the corrosion-resistant plate P1 on the receiving surface 71 is inclined such that the drain portion 73 is the lowermost. The temperature of the receiving surface 71 of the receiving plate member 18 is maintained to be above the melting point of the debris DB and the waste material. The heat of the receiving surface 71 of the receiving plate member 18 is transferred to the debris DB and the waste material through the corrosion-resistant plate P1 to maintain the liquid phase of the debris DB and the waste material. As a result, the debris DB and the waste material dropped on the corrosion-resistant plate P1 can be prevented from solidifying on the corrosion-resistant plate P1, and the debris DB and the waste material can flow on the corrosion-resistant plate P1 while protecting the receiving surface 71 with the corrosion-resistant plate P1.

To prevent the corrosion-resistant plate P1 from separating from the receiving surface 71 of the receiving plate 18 when the receiving plate 18 is inclined, the side edges of the corrosion-resistant plate P1 may be in contact with the inner walls of the peripheral wall portion 72 of the receiving plate 18. In this case, the position of the corrosion-resistant plate P1 on the receiving surface 71 of the receiving plate member 18 can be stabilized by the frictional force between the side edges of the corrosion-resistant plate P1 and the inner walls of the peripheral wall portion 72 of the receiving plate member 18.

Figure 10:
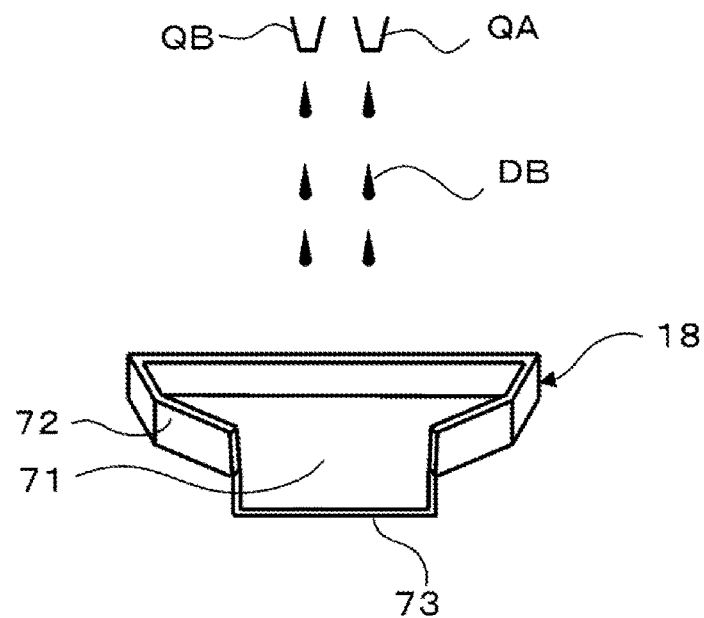
FIG. 10 is a perspective view of the receiving plate member from which the corrosion-resistant plate shown in FIG. 7 is removed when the receiving plate member receives droplets of debris.
Figure 11:
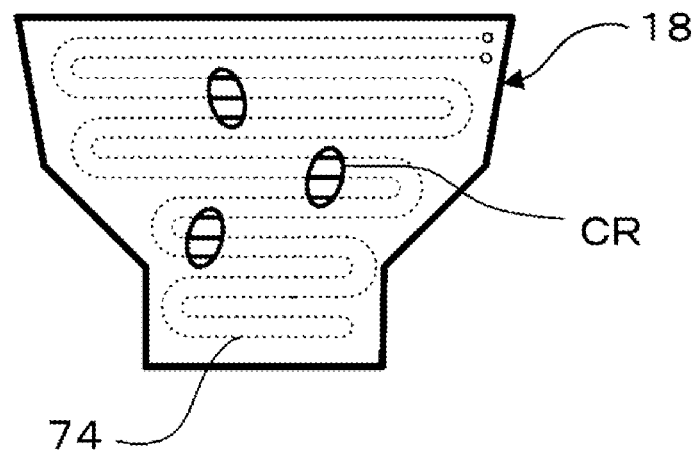
FIG. 11 is a plan view of an example of a damaged state of the receiving surface of the receiving plate member in FIG. 10.

FIG. 10 is a perspective view of the receiving plate member from which the corrosion-resistant plate shown in FIG. 7 is removed when the receiving plate member receives droplets of debris. FIG. 11 is a plan view of an example of a damaged state of the receiving surface of the receiving plate member in FIG. 10.

As shown in FIG. 10, in a case in which the corrosion-resistant plate P1 is not disposed on the receiving surface 71, if the receiving surface 71 continuously receives the droplets of debris DB and waste material such as tin heated above the melting point, stainless steel, which is the base material of the receiving plate member 18, reacts with tin. Accordingly, as shown in FIG. 11, corrosion of the receiving surface 71 by tin progresses. When the corrosion of the receiving surface 71 progresses, the heating means 74 embedded beneath the receiving surface 71 is exposed from corroded portions CR, and the heating means 74 is also damaged by tin.

Figure 12:
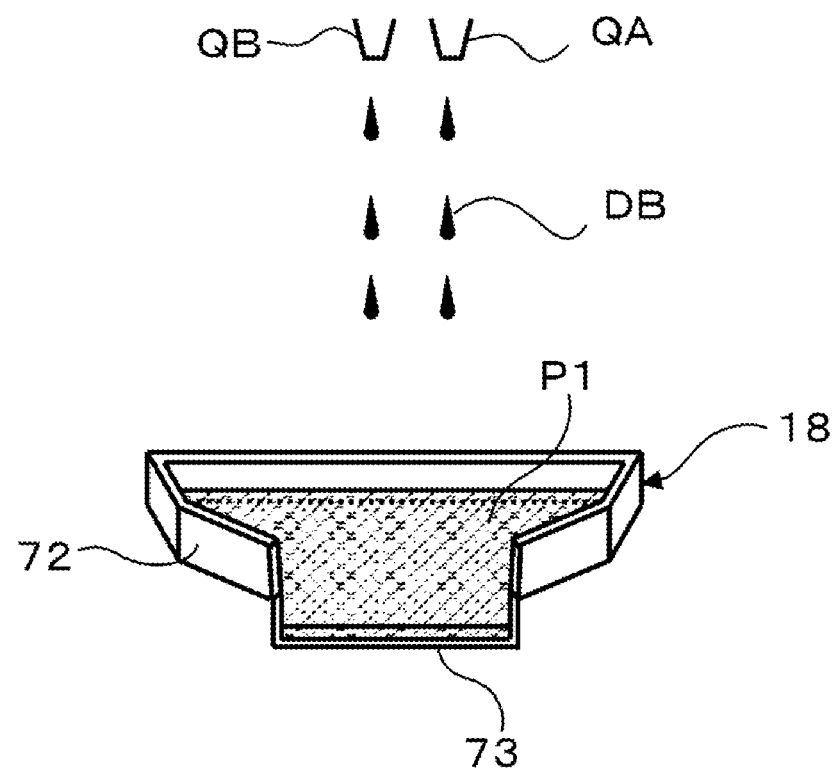
FIG. 12 is a perspective view of the receiving plate member to which the corrosion-resistant plate shown in FIG. 7 is attached when the receiving plate member receives droplets of debris.

FIG. 12 is a perspective view of the receiving plate member to which the corrosion-resistant plate shown in FIG. 7 is attached when the receiving plate member receives droplets of debris.

As shown in FIG. 12, in a case in which the corrosion-resistant plate P1 is disposed on the receiving surface 71, it is possible to restrain the reaction of the debris DB and the waste material such as tin heated above the melting point with stainless steel, which is the base metal of the receiving plate member 18. Therefore, it is possible to prevent the heating means 74 embedded beneath the receiving surface 71 from being exposed, and to minimize the problem of damage to the heating means 74 by tin.

Figure 13:
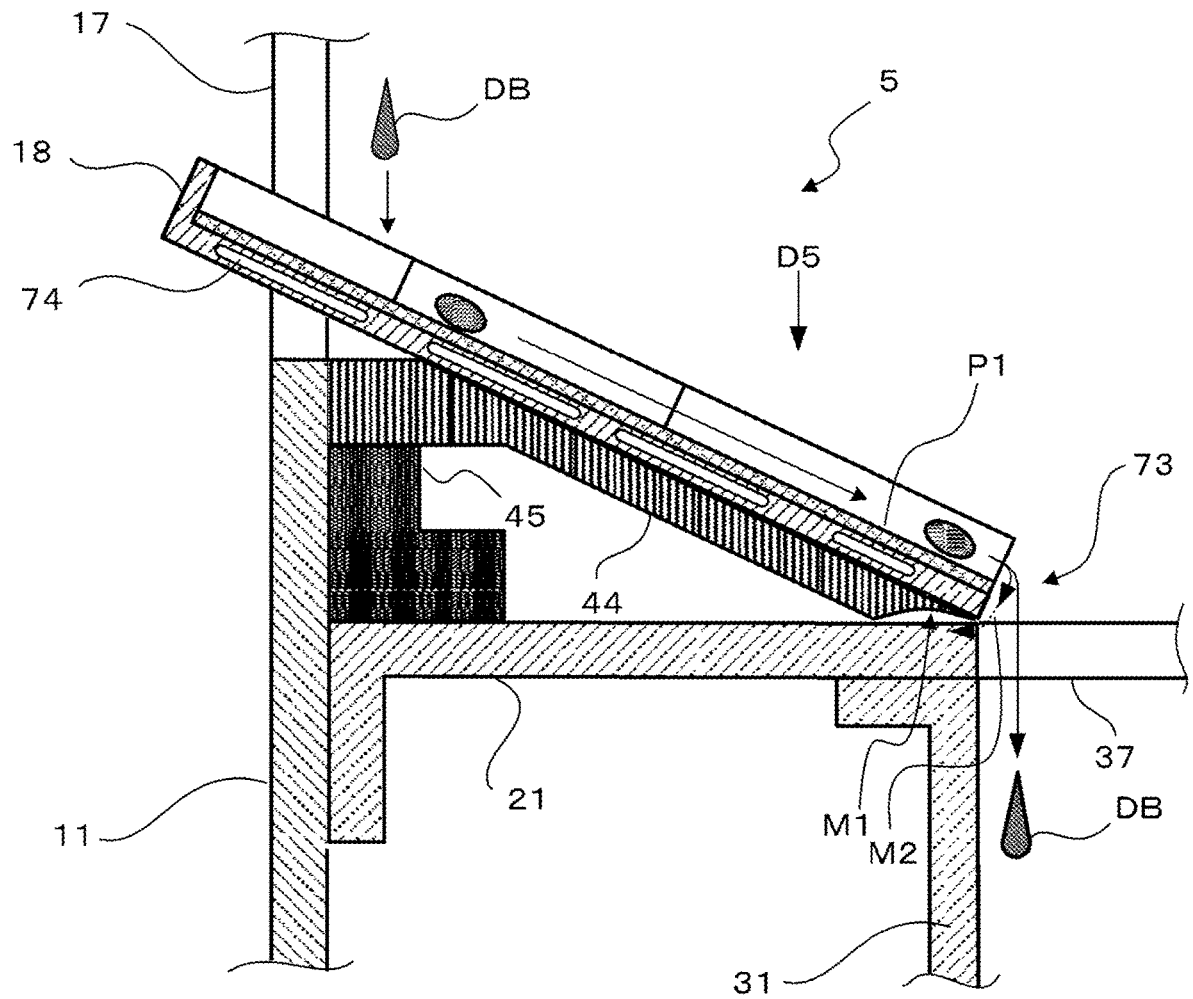
FIG. 13 is a cross-sectional view showing an outline structure of a guiding part shown in FIG. 2.

FIG. 13 is a cross-sectional view showing an outline structure of a guiding part shown in FIG. 2.

As shown in FIG. 13, a supporting stage 44 and a supporting-stage support 45 are disposed in the connection chamber 21. The receiving plate member 18 is supported by the supporting stage 44 such that the corrosion-resistant plate P1 is placed on the receiving surface 71. The supporting stage 44 has an inclined flat surface and the receiving plate member 18 has a lower flat surface. The height of the inclined surface of the supporting stage 44 is reduced toward the side on the through-hole 37 from the side on the window 17. Accordingly, by placing the receiving plate member 18 on the supporting stage 44, the supporting stage can support the receiving plate member 18 so that the receiving plate member 18 is in an inclined attitude in which the drain portion 73 above the debris storage vessel 31 is the lowermost. The supporting stage 44 is supported by the supporting-stage support 45 such that the side on the through-hole 37 is lower than the side on the window 17. The upstream side (the side on the window 17) of the supporting stage 44 can be supported by the supporting-stage support 45, and the downstream side (the side on the through-hole 37) of the supporting stage 44 can be supported by the upper surface of the bottom of the connection chamber 21.

The supporting stage 44 may be provided with a hollow space M1 on the lower surface of the distal side of the supporting stage 44 so that the lower edge of the supporting stage 44 is in line contact with the upper surface of the bottom of the connection chamber 21. The location of the line contact can be in the vicinity of the drain portion 73 of the receiving plate member 18 at which the supporting stage 44 is in contact with the upper surface of the bottom of the connection chamber 21. By providing the hollow space M1 on the lower surface of the distal portion of the supporting stage 44, an upward slope is formed on the lower surface of the distal portion of the supporting stage 44 for an intrusion M2 of the liquid of the debris DB and the waste material near the drain portion 73. When the liquid of the debris DB and the waste material is on the point of the gap between the supporting stage 44 and the upper surface of the bottom of the connection chamber 21 as the intrusion M2, the upward slope can return the intrusion M2 to the drain portion 73 by the force of gravity. Accordingly, the intrusion M2 of the liquid of the debris DB and the waste material can be minimized, so that the liquid of the debris DB and the waste material that has reached the lower edge of the supporting stage 44 can be easily drained from the supporting stage 44.

Figure 14:
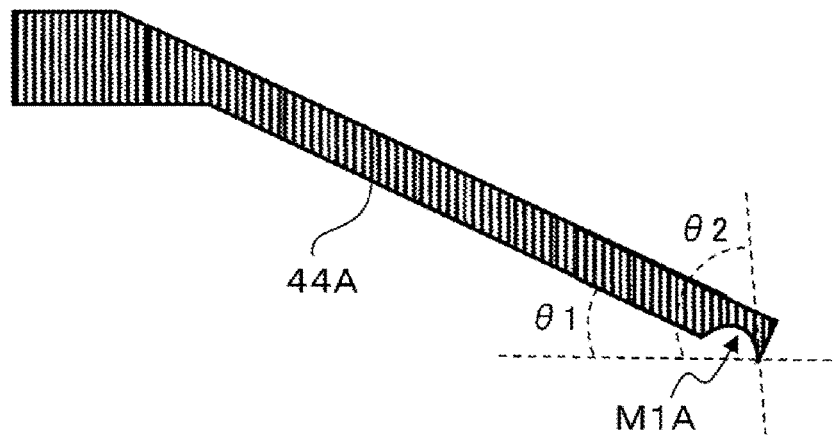
FIG. 14 is a cross-sectional view showing another example of the supporting stage.

FIG. 14 is a cross-sectional view showing another example of the supporting stage.

In the supporting stage 44A of FIG. 14, a hollow space M1A is provided instead of the hollow space M1 of the supporting stage 44 of FIG. 13. The hollow space M1A is also formed so that the lower edge of the supporting stage 44A is in line contact with the upper surface of the bottom of the connection chamber 21. Whereas the distal edge of the supporting stage 44 in FIG. 13 is sharp, the distal edge of the supporting stage 44A in FIG. 14 is flat.

The inclination angle θ2 of the hollow space M1A at the position of the line contact at the lower edge of the supporting stage 44A can be greater than the inclination angle θ1 of the supporting stage 44A. This can increase the angle of the upward slope for the intrusion M2 of the liquid of the debris DB and the waste material into the hollow space M1A, and can more effectively restrict the intrusion M2 of the liquid of the debris DB and the waste material.

Figure 15:
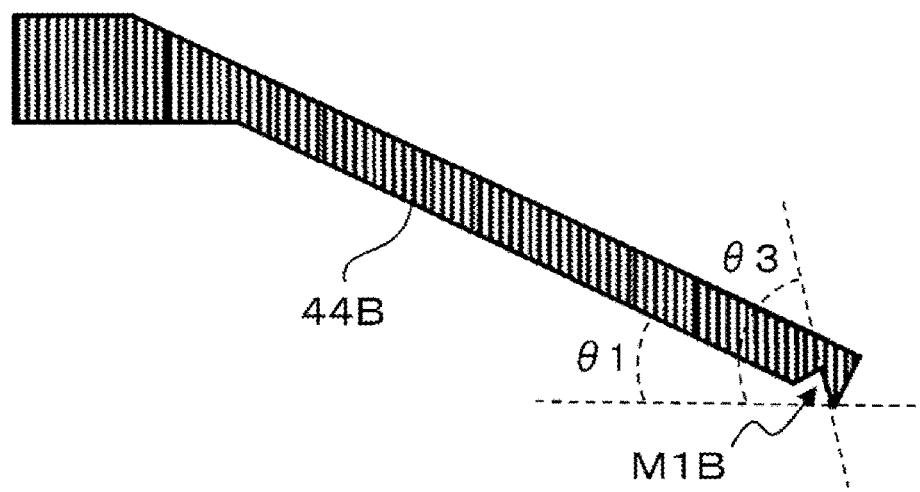
FIG. 15 is a cross-sectional view showing another example of the supporting stage.

FIG. 15 is a cross-sectional view showing another example of the supporting stage of.

In the supporting stage 44B of FIG. 15, a hollow space M1B is provided instead of the hollow space M1A of the supporting stage 44A of FIG. 14. The hollow space M1B is also formed so that the lower edge of the supporting stage 44B is in line contact with the upper surface of the bottom of the connection chamber 21. Whereas the hollow space M1A in FIG. 14 has an arc shape in cross section, the cross-sectional shape of the hollow space M1B in FIG. 15 is triangular. The inclination angle θ3 of the hollow space M1B at the position of the line contact at the lower edge of the supporting stage 44B can be greater than the inclination angle θ1 of the supporting stage 44B.

Thus, the cross-sectional shape of the hollow space that facilitates line contact of the lower edge of the supporting stage with the upper surface of the bottom of the connection chamber 21 may be curvilinear as shown in FIGS. 13 and 14, may consist of straight lines as shown in FIG. 15, or may consist of curved and straight lines.

The cross-sectional shape of the hollow space M1A or M1B may be arbitrary as long as the inclination angle θ2 or θ3 of the hollow space M1A or M1B at the position of the line contact at the lower edge of the supporting stage 44A or 44B is greater than the inclination angle θ1 of the supporting stage 44A or 44B.

Figure 16:
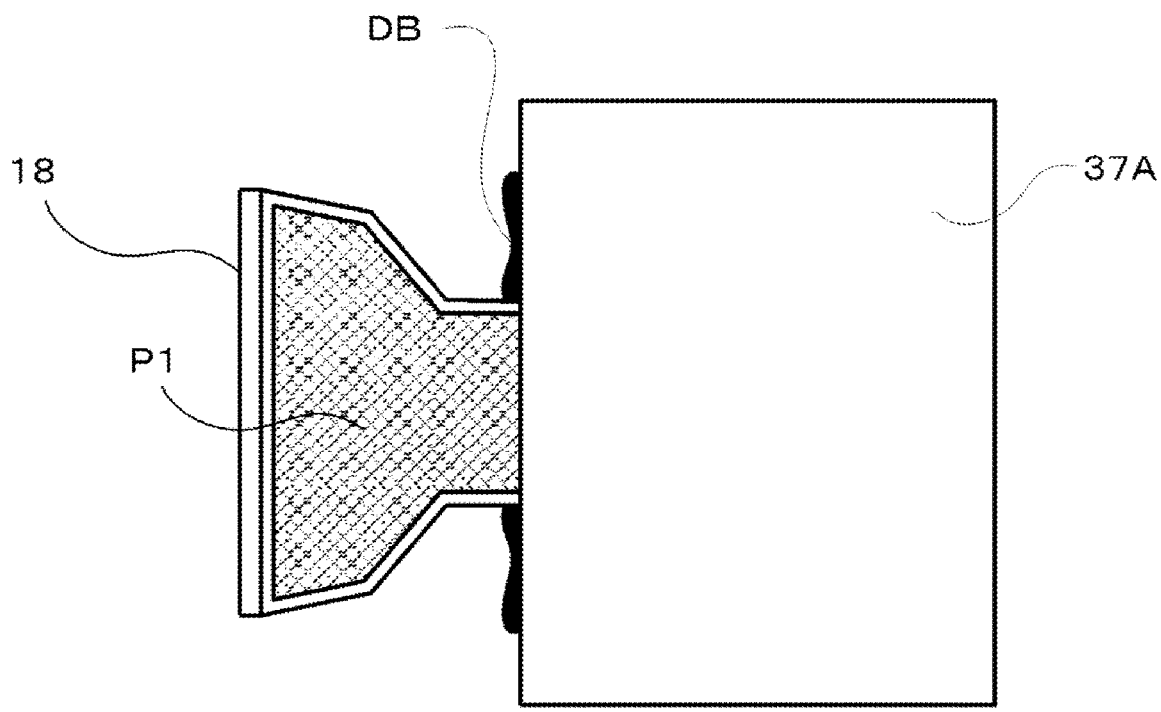
FIG. 16 is a plan view of the receiving plate member viewed along line D5 in FIG. 13, showing an example of debris leakage from the receiving plate member.
Figure 17:
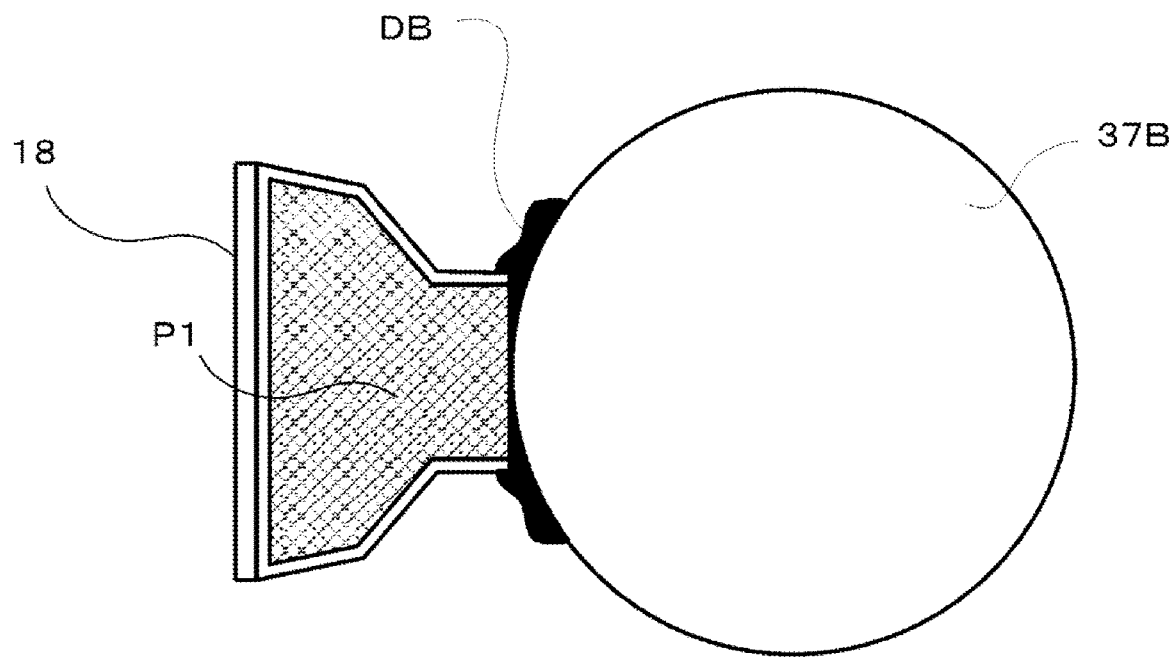
FIG. 17 is a plan view of the receiving plate member viewed along line D5 in FIG. 13, showing another example of debris leakage from the receiving plate member.

FIG. 16 is a plan view of the receiving plate member viewed along line D5 in FIG. 13, showing an example of debris leakage from the receiving plate member. FIG. 17 is a plan view of the receiving plate member viewed along line D5 in FIG. 13, showing another example of debris leakage from the receiving plate member. FIG. 16 shows that the contour of the through-hole 37 of FIG. 13 is rectangular and symbol 37A indicates the through-hole, whereas FIG. 17 shows that the contour of the through-hole 37 of FIG. 13 is circular and symbol 37B indicates the through-hole.

As shown in FIG. 13, by providing the hollow space M1 on the lower surface of the distal side of the supporting stage 44 so that the lower edge of the supporting stage 44 is in line contact with the upper surface of the bottom of the connection chamber 21, it is possible to prevent the liquid of the debris DB and the waste material from going to the lower surface of the supporting stage 44. However, as shown in FIG. 16, the liquid of debris DB and waste material such as tin may leak into regions that are around the through-hole 37A of the connection chamber 21 connected to the debris storage vessel 31 and that are near the drain portion 73. In the case of the through-hole 37A, which is rectangular in planar shape, the edge of the drain portion 73 of the receiving plate member 18 can be substantially aligned with the edge of the through-hole 37A, so that the impact of the leaked liquid of debris DB and waste material is relatively low.

On the other hand, as shown in FIG. 17, in the case of the through-hole 37B, which is circular in planar shape, the edge of the drain portion 73 of the receiving plate member 18 cannot be aligned with the periphery of the through-hole 37B, so that the impact of the leaked liquid of debris DB and waste material is relatively high.

Figure 18:
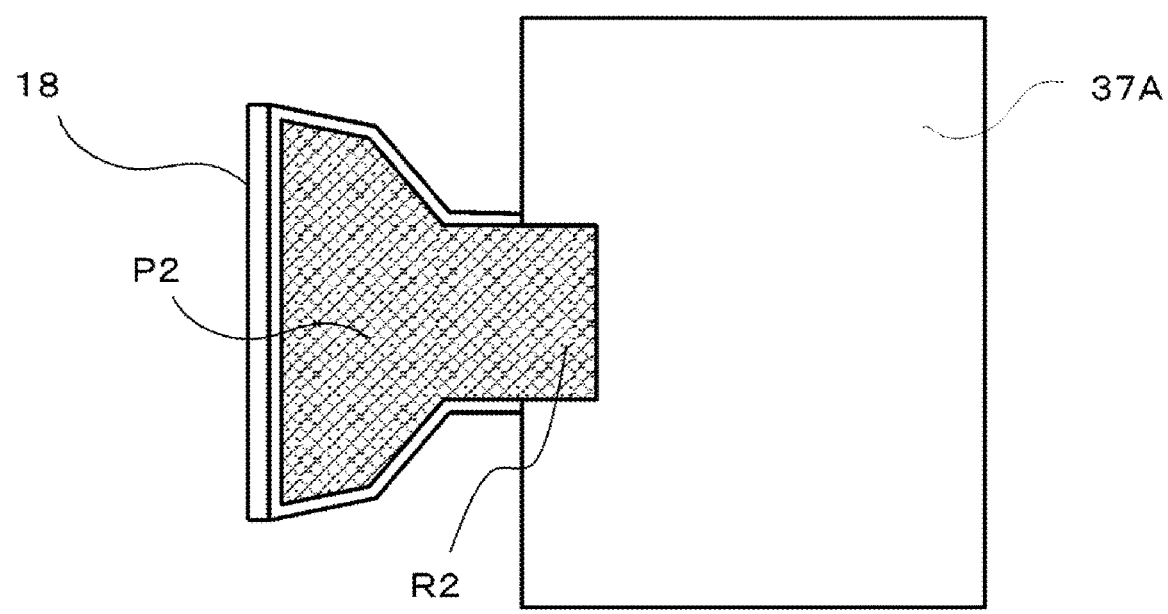
FIG. 18 is a plan view of a deployment example of a receiving plate member on which a corrosion-resistant plate is mounted according to a second embodiment, viewed along line D5 in FIG. 13.
Figure 19:
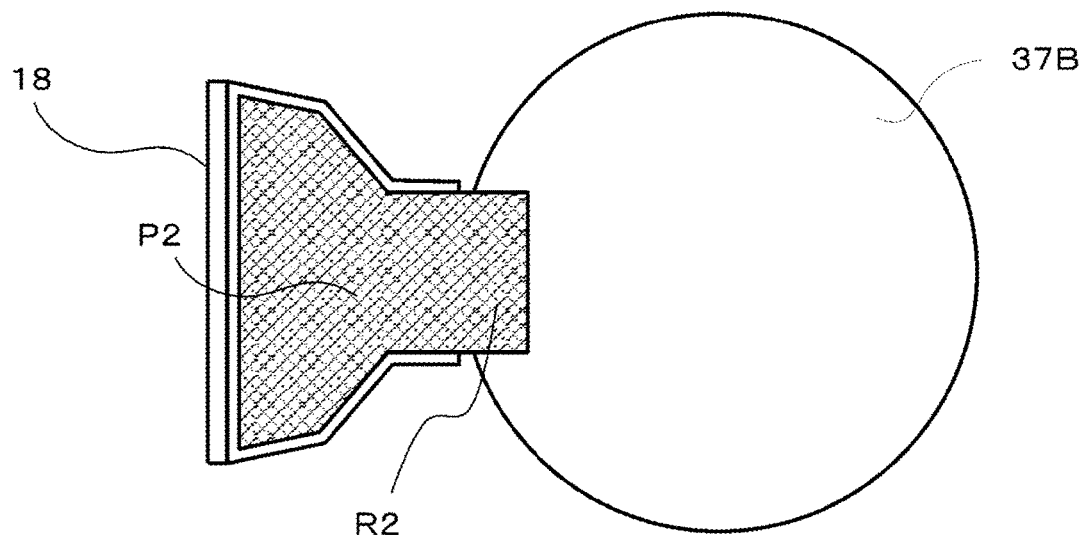
FIG. 19 is a plan view of another deployment example of the receiving plate member on which the corrosion-resistant plate is mounted according to the second embodiment, viewed along line D5 in FIG. 13.
Figure 20:
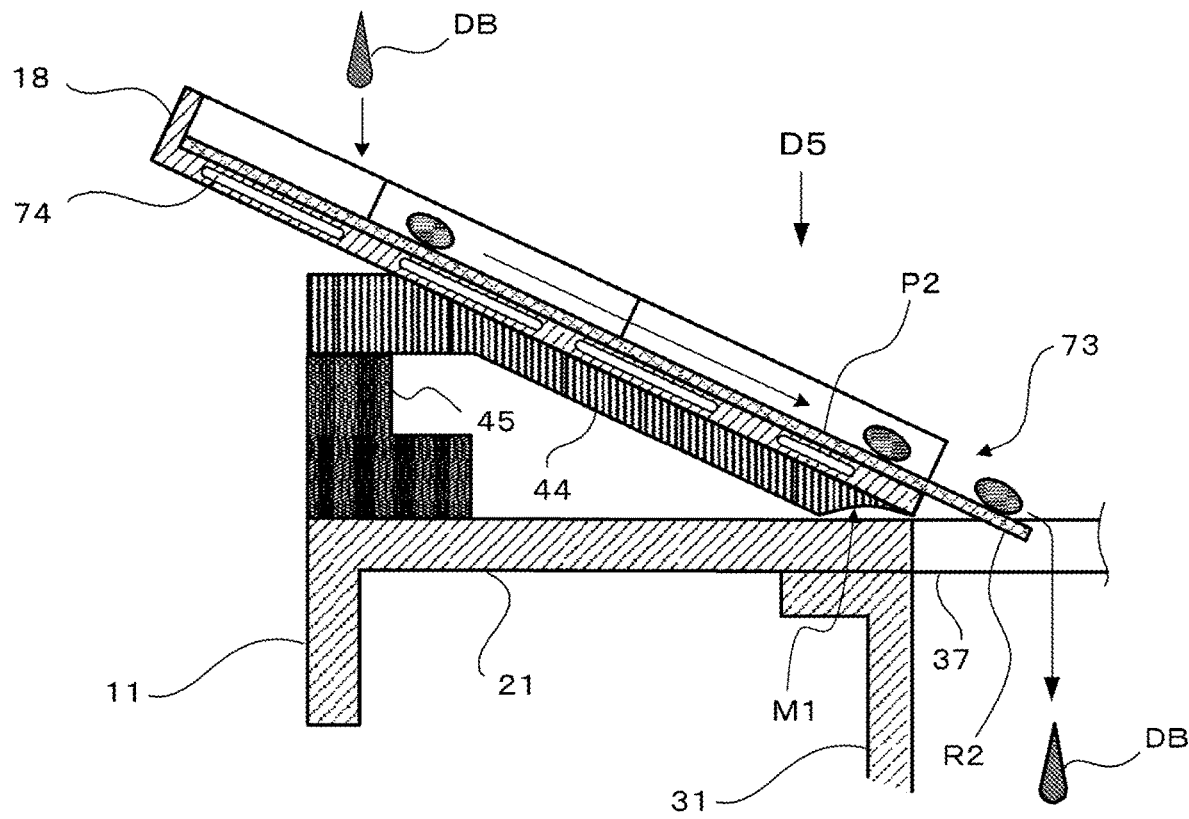
FIG. 20 is a cross-sectional view showing an outline structure of a guiding part that has the receiving plate member on which the corrosion-resistant plate is mounted according to the second embodiment.

FIG. 18 is a plan view of a deployment example of a receiving plate member on which a corrosion-resistant plate is mounted according to a second embodiment, viewed along line D5 in FIG. 13. FIG. 19 is a plan view of another deployment example of the receiving plate member on which the corrosion-resistant plate is mounted according to the second embodiment, viewed along line D5 in FIG. 13. FIG. 20 is a cross-sectional view showing an outline structure of a guiding part that has the receiving plate member on which the corrosion-resistant plate is mounted according to the second embodiment. FIG. 18 shows that the contour of the through-hole 37 of FIG. 13 is rectangular and symbol 37A indicates the through-hole, whereas FIG. 19 shows that the contour of the through-hole 37 of FIG. 13 is circular and symbol 37B indicates the through-hole.

As shown in FIGS. 18 to 20, a corrosion-resistant plate P2 is disposed on the receiving surface 71 of the receiving plate member 18. The distal end of the corrosion-resistant plate P2 protrudes from the edge of the receiving surface 71 of the receiving plate member 18. Specifically, a protrusion R2 is provided at the distal end of the corrosion-resistant plate P2. The width of the protrusion R2 of the corrosion-resistant plate P2 can be equal to the width of the drain portion 73 of the receiving plate member 18. By providing the corrosion-resistant plate P2 with the protrusion R2, when the receiving plate 18 is disposed on the supporting stage 44, the edge of the corrosion-resistant plate P2 exceeds the periphery of the through-hole 37 and is located above the through-hole 37 when viewed along line D5 in FIG. 20.

As shown in FIG. 20, the droplets of debris DB and waste material received by the corrosion-resistant plate P2 disposed on the receiving plate member 18 are guided to the debris storage vessel 31 connected to the through-hole 37 over the peripheral edge of the through-hole 37. Accordingly, it is possible to prevent the liquid of debris DB and waste material from leaking to the periphery of the through hole 37A or 37B in a case in which the corrosion-resistant plate P2 is disposed on the receiving surface 71 of the receiving plate member 18 as shown in FIGS. 18 and 19. This is in contrast to the case in which the corrosion-resistant plate P1 is disposed on the receiving surface 71 of the receiving plate member 18 as shown in FIGS. 16 and 17 and the liquid of debris DB and waste material leaks to the periphery of the through hole 37A or 37B.

Figure 21:
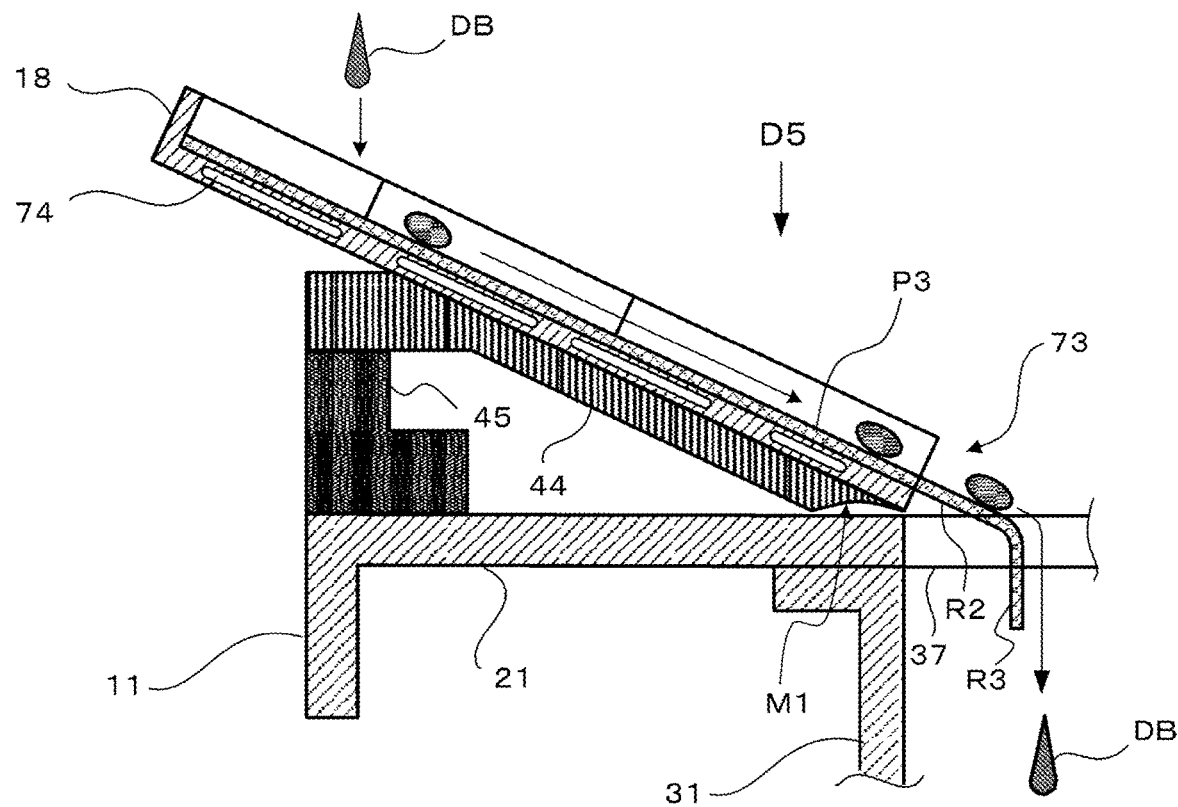
FIG. 21 is a cross-sectional view showing an outline structure of a guiding part that has the receiving plate member on which another corrosion-resistant plate is mounted according to a third embodiment.

FIG. 21 is a cross-sectional view showing an outline structure of a guiding part that has the receiving plate member on which another corrosion-resistant plate is mounted according to a third embodiment.

As shown in FIG. 21, a corrosion-resistant plate P3 is disposed on the receiving surface 71 of the receiving plate member 18. The corrosion-resistant plate P3 is bent so that the distal end of the corrosion-resistant plate P3 extends downward along the direction in which the droplets of debris DB and waste material fall. The corrosion-resistant plate P3 may be bent so that the surface of the distal end of the corrosion-resistant plate P3 is parallel to the vertical direction.

Specifically, a bent portion R3 is formed at the distal end of the corrosion-resistant plate P3. When the receiving plate member 18 is disposed on the supporting stage 44, the bent portion R3 exceeds the periphery of the through-hole 37 and is located above the through-hole 37 when viewed along line D5 in FIG. 21. The bent portion R3 may be connected to the protrusion R2 of the corrosion-resistant plate P3. This enables the guiding direction of the debris DB and the waste material by the corrosion-resistant plate P3 at the distal end thereof to coincide with the falling direction of the debris DB and the waste material. Accordingly, the droplets of debris DB and waste material received by the corrosion-resistant plate P3 can be guided over the peripheral edge of the through-hole 37 into the debris storage vessel 31 with certainty.

Figure 22:
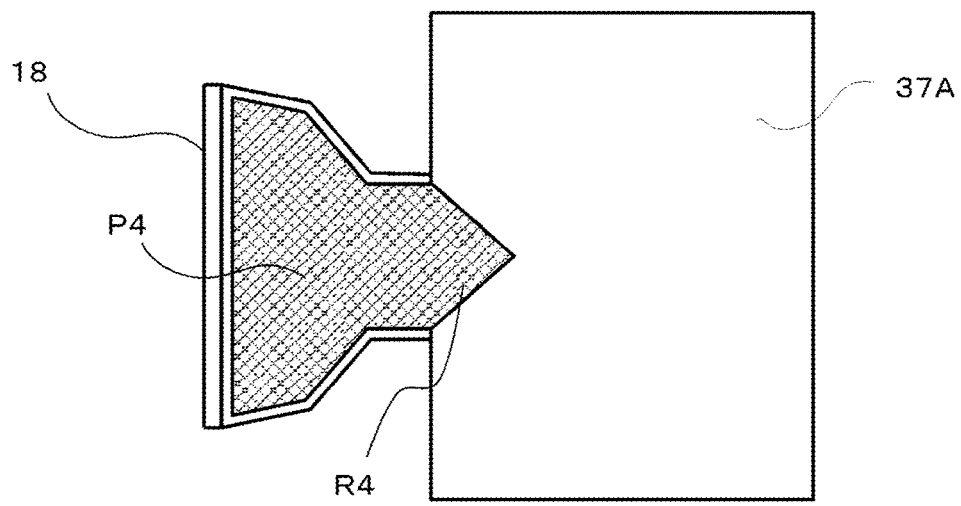
FIG. 22 is a plan view of a deployment example of a receiving plate member on which a corrosion-resistant plate is mounted according to a fourth embodiment, viewed along line D5.
Figure 23:
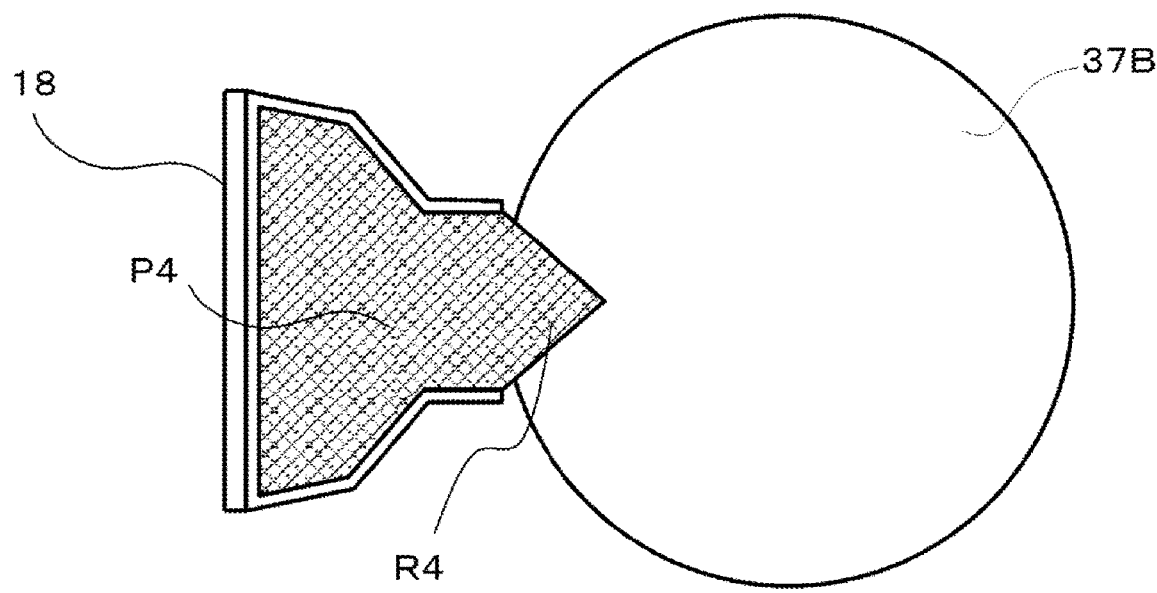
FIG. 23 is a plan view of another deployment example of the receiving plate member on which the corrosion-resistant plate is mounted according to the fourth embodiment, viewed along line D5.

FIG. 22 is a plan view of a deployment example of a receiving plate member on which a corrosion-resistant plate is mounted according to a fourth embodiment, viewed along line D5 in FIG. 21. FIG. 23 is a plan view of another deployment example of the receiving plate member on which the corrosion-resistant plate is mounted according to the fourth embodiment, viewed along line D5 in FIG. 21. FIG. 22 shows that the contour of the through-hole 37 of FIG. 13 is rectangular and symbol 37A indicates the through-hole, whereas FIG. 23 shows that the contour of the through-hole 37 of FIG. 13 is circular and symbol 37B indicates the through-hole.

As shown in FIGS. 22 and 23, a corrosion-resistant plate P4 is disposed on the receiving surface 71 of the receiving plate member 18. The distal end of the corrosion-resistant plate P4 has a protrusion R4 that protrudes from the edge of the receiving surface 71 of the receiving plate member 18. However, whereas the width of the protrusion R2 of the corrosion-resistant plate P2 in FIGS. 18 and 19 is uniform, the width of the protrusion R4 of the corrosion-resistant plate P4 in FIGS. 22 and 23 gradually narrows toward the distal edge of the corrosion-resistant plate P4. When the receiving plate 18 is disposed on the supporting stage 44, the distal end of the protrusion R4 exceeds the periphery of the through-hole 37A or 37B and is located above the through-hole 37A or 37B when viewed along line D5 in FIG. 20.

Accordingly, the corrosion-resistant plate P4 facilitates gathering of the droplets of debris DB and waste material dropped on the corrosion-resistant plate P4 at the distal end of the protrusion R4. Accordingly, the liquid of the debris DB and the waste material that has reached the distal end of the corrosion-resistant plate P4 can be easily drained from the corrosion-resistant plate P4, and can be guided over the peripheral edge of the through-hole 37A or 37B into the debris storage vessel 31 with certainty.

Figure 24:
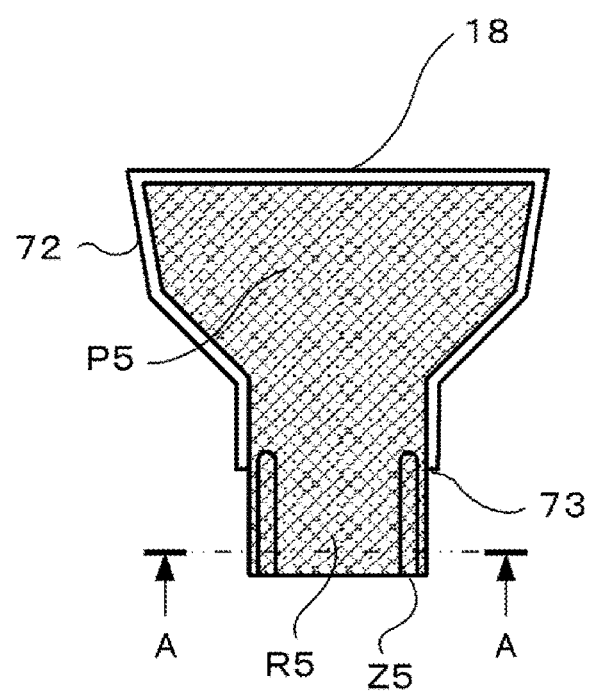
FIG. 24 is a plan view of a deployment example of a receiving plate member on which a corrosion-resistant plate is mounted according to a fifth embodiment.
Figure 25:
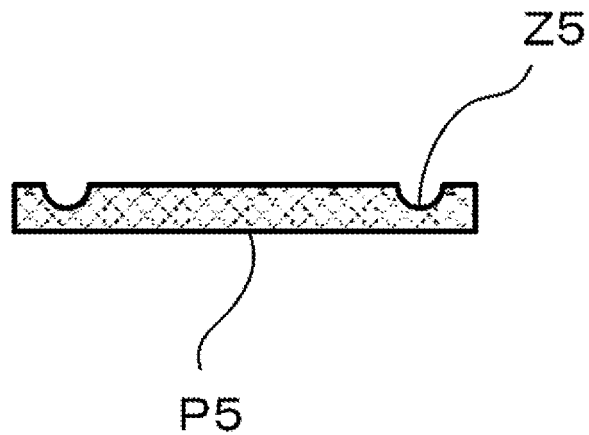
FIG. 25 is a cross-sectional view taken along line A-A in FIG. 24.

FIG. 24 is a plan view of a deployment example of a receiving plate member on which a corrosion-resistant plate is mounted according to a fifth embodiment. FIG. 25 is a cross-sectional view taken along line A-A in FIG. 24.

As shown in FIGS. 24 and 25, a corrosion-resistant plate P5 is disposed on the receiving surface 71 of the receiving plate member 18. A protrusion R5 is formed at the distal end of the corrosion-resistant plate P5. On the upper surface of the corrosion-resistant plate P5, grooves Z5 are formed near the side edges of the protrusion R5. The grooves Z5 reach the distal end of the protrusion R5 along the side edges of the protrusion R5. The grooves Z5 may extend more rearward (more upstream) than the drain portion 73 of the receiving plate member 18.

By providing the grooves Z5 on the upper surface of the corrosion-resistant plate P5, the liquid of debris DB and waste material moving along the side edges of the protrusion R5 of the corrosion-resistant plate P5 can be guided through the grooves Z5 to the distal end of the corrosion-resistant plate P5 and into the debris storage vessel 31 more securely. Therefore, even when the side edges of the protrusion R5 is not surrounded by the peripheral wall portion 72 of the receiving plate 18, it is possible to prevent the liquid of debris DB and waste material from falling from the side edges of the protrusion R5.

Thus, the liquid of debris DB and waste material is prevented from falling from the side edges of the protrusion R5, it is no longer necessary to form a peripheral wall portion near the side edges of the protrusion of the corrosion-resistant plate. This can eliminate the need for bending or other processing to form the peripheral wall portion near the side edges of the protrusion R5 of the corrosion-resistant plate P5. Accordingly, even when the corrosion-resistant plate P5 is made of a hard material such as tungsten or a hard but brittle material such as molybdenum, it is possible to avoid the difficult process for the corrosion-resistant plate P5 while reducing the fall of the liquid of debris and waste material from the side edges of the protrusion R5.

Figure 26:
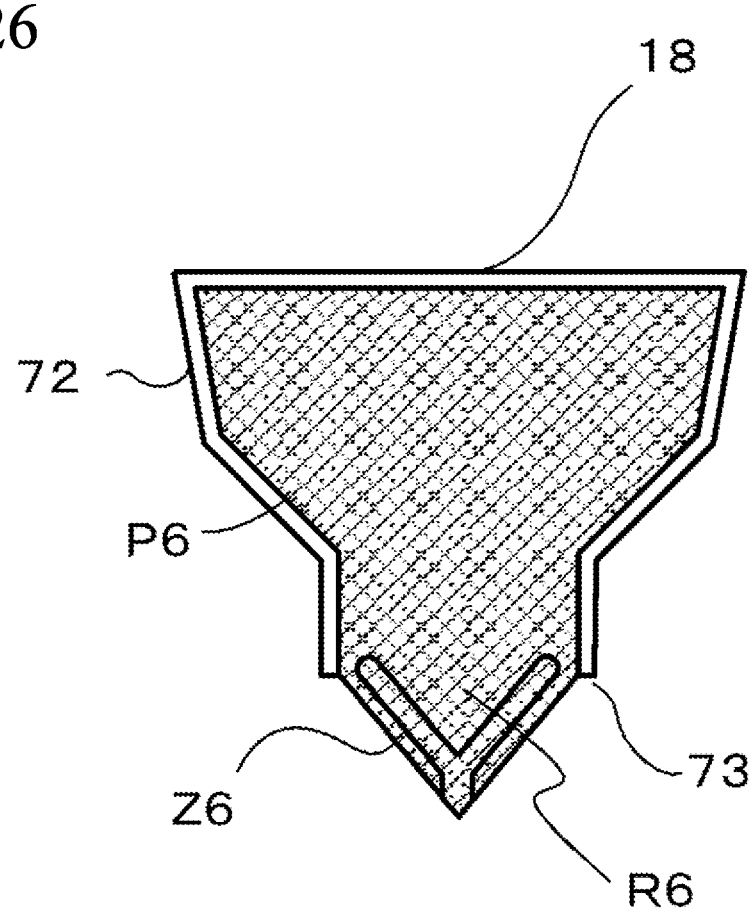
FIG. 26 is a plan view of a deployment example of a receiving plate member on which a corrosion-resistant plate is mounted according to a sixth embodiment.

FIG. 26 is a plan view of a deployment example of a receiving plate member on which a corrosion-resistant plate is mounted according to a sixth embodiment.

As shown in FIG. 26, a corrosion-resistant plate P6 is disposed on the receiving surface 71 of the receiving plate member 18. A protrusion R6 is formed at the distal end of the corrosion-resistant plate P6. Whereas the width of the corrosion-resistant plate P5 in FIG. 24 is uniform, the width of the corrosion-resistant plate P6 in FIG. 26 gradually narrows toward the distal end of the corrosion-resistant plate P6. On the upper surface of the corrosion-resistant plate P6, a Y-shaped groove Z6 is formed near the side edges of the protrusion R6. The groove Z6 extends along the side edges of the protrusion R6 and reaches the distal end of the protrusion R6. The groove Z6 may split into two prongs from the vicinity of the distal end of the protrusion R6 and the prongs extend along the side edges of the protrusion R6 to reach more upstream than the drain portion 73 of the receiving plate member 18.

By providing the groove Z6 on the upper surface of corrosion-resistant plate P6, the liquid of debris DB and waste material moving along the side edges of the protrusion R6 of the corrosion-resistant plate P6 can be guided through the groove Z6 and can be gathered at the distal end of the corrosion-resistant plate P6 over the periphery of through-hole 37A or 37B. Accordingly, the liquid of debris DB and waste material can be more securely guided into the debris storage vessel 31.

The distal end of the protrusion R4, R5, or R6 of the corrosion-resistant plate P4, P5, or P6 in FIG. 22, 24, or 26 may be bent, in a manner similar to that shown in FIG. 21, to extend downward along the direction in which the droplets of debris DB and waste material fall.

In the above-described embodiments, an LDP-type EUV light source apparatus has been described as an example, but the receiving plate member on which any one of the above-described corrosion-resistant plates is mounted may be used for an LPP-type EUV light source apparatus.

Hereinafter, an example of an LPP-type EUV light source apparatus having a receiving plate member on which a corrosion-resistant plate is mounted will be described.

Figure 27:
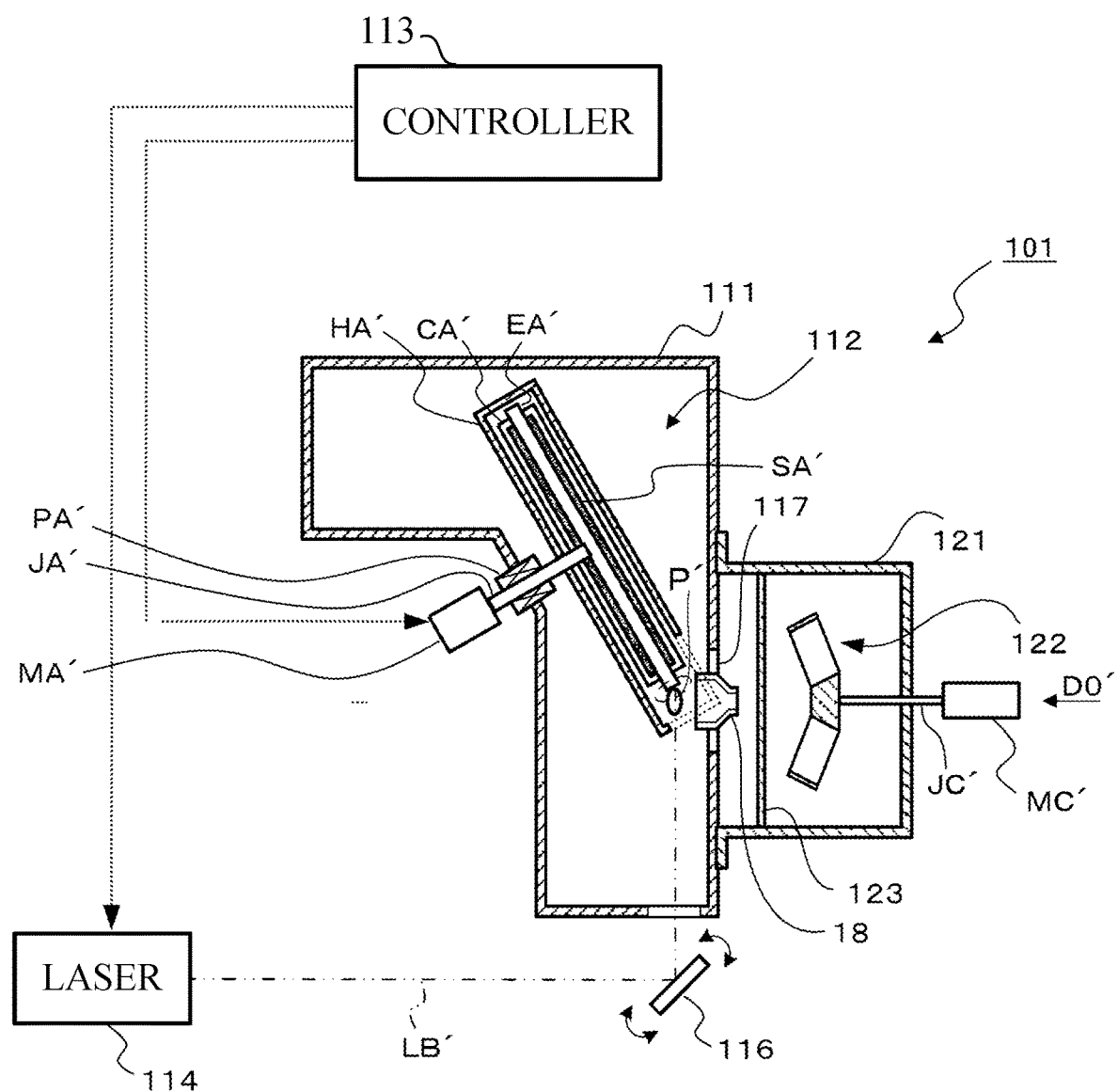
FIG. 27 is a cross-sectional view of an extreme ultraviolet light source apparatus according to a seventh embodiment, in which a chamber and a connection chamber are cutaway horizontally.
Figure 28:
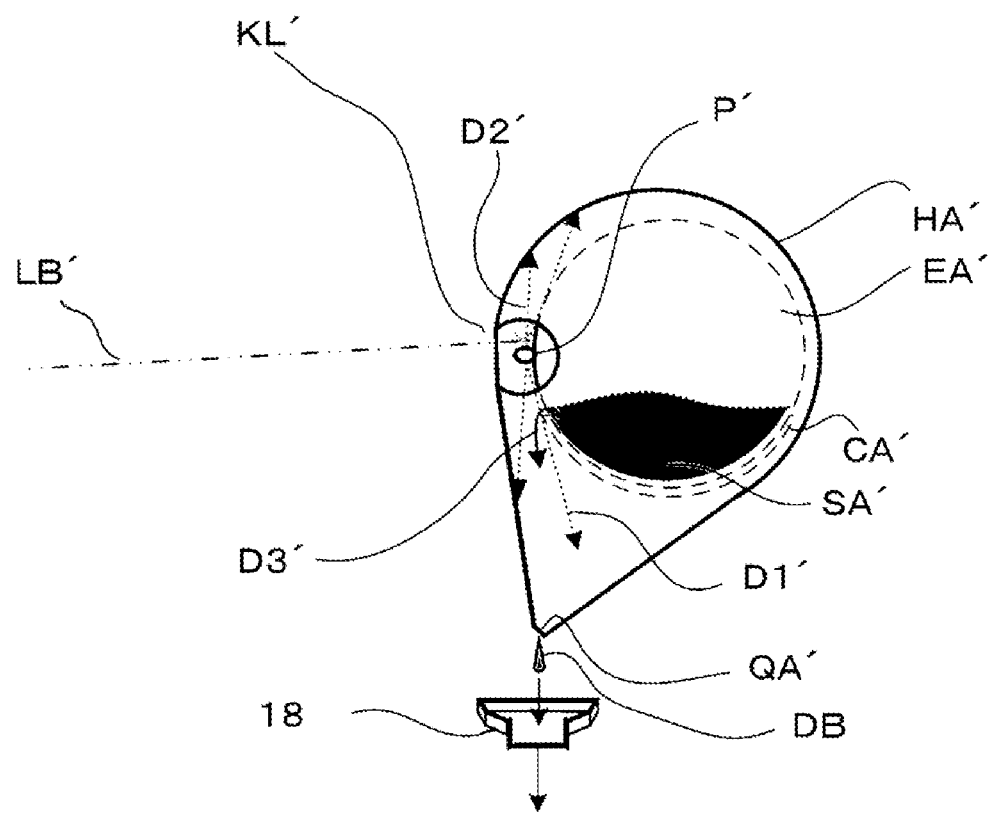
FIG. 28 is a side view of a light source part in the extreme ultraviolet light source apparatus viewed along line DO' in FIG. 27.

FIG. 27 is a cross-sectional view of an extreme ultraviolet light source apparatus according to a seventh embodiment, in which a chamber and a connection chamber are cutaway horizontally. FIG. 28 is a side view of a light source part in the extreme ultraviolet light source apparatus viewed along line DO' in FIG. 27.

As shown in FIGS. 27 and 28, in the LPP scheme, a target material is irradiated with a driver laser beam for generation of plasma P', and EUV light is emitted from the plasma P. The target material is, for example, tin as the plasma raw material for EUV generation. The target material may be supplied as droplets.

The driver laser for plasma generation may be a pulsed laser system, e.g., one of a gas discharge excimer laser, a $CO_2$ laser, and a molecular fluorine laser that operate at a high power level and at a high pulse rate.

An LPP-type EUV light source apparatus includes a structure in which the target material (plasma raw material) is supplied by means of a disk-shaped rotor, as disclosed, for example, in Japanese Patent No. 6241062.

Specifically, as shown in FIG. 27, the EUV light source apparatus 101 includes a chamber 111 that isolates the plasma P' generated inside thereof from the outside. The chamber 111 is formed of a rigid material, e.g., a metal. The chamber 111 is a vacuum housing, and the interior thereof is kept in a depressurized atmosphere in order to heat and excite the plasma raw material SA' and to restrict attenuation of the EUV light generated in the exciting process.

A light source part 112 is located within the chamber 111 for generating the plasma P', which emits EUV light.

The light source part 112 includes a raw material supply plate EA' that is a disk-shaped member. The raw material supply plate EA' is formed of, for example, a high-melting-point metal such as tungsten, molybdenum, or tantalum.

The raw material supply plate EA' is connected to the rotational shaft JA' of the motor MA' and rotates about the axis of the raw material supply plate EA'. The motor MA' is located outside the chamber 111, and the rotational shaft JA' of the motor MA' extends from the outside of the chamber 111 to the inside of the chamber 111. The gap between the rotational shaft JA' and the wall of the chamber 111 is sealed with a sealing member PA' such as a mechanical seal. The seal member PA' rotatably supports the rotational shaft JA' while maintaining a reduced-pressure atmosphere in the chamber 111. The rotation of the motors MA' is controlled by a controller 113.

A container CA' for storing the liquid-phase plasma raw material SA' is disposed inside the chamber 111. The heated liquid-phase plasma raw material SA' is supplied to the container CA'. The liquid-phase plasma raw material SA' is, for example, tin.

A lower part of the discharge electrode EA' is immersed in the plasma raw material SA' in the container CA'. As a result, the liquid-phase plasma raw material SA' adheres to the lower part of the discharge electrode EN. As the discharge electrode EA' rotates, the liquid-phase plasma raw material SA' is transported to a laser beam irradiation region at which the plasma P' is to be generated.

A laser 114 is located outside the chamber 111. The laser 114 generates plasma P' by irradiating an energy beam onto the plasma raw material SA' on the raw material supply plate EA' transported to the laser beam irradiation region. The laser 114 is, for example, a $CO_2$ laser, and emits an infrared laser beam LB' having a wavelength of 10.6 micrometers. However, the laser 114 may be another device that emits a laser beam other than the $CO_2$ laser beam capable of heating the plasma raw material SA' to generate the plasma P'.

Illumination timing of the laser beam LB' by the laser 114 is controlled by the controller 113. The laser beam LB' emitted from the laser 114 is reflected by a movable mirror 116 located outside the chamber 111, a transparent window 118 in the wall of the chamber 111, and illuminates the outer peripheral surface of the raw material supply plate EA'.

The position in the raw material supply plate EA' irradiated with the laser beam LB' is adjusted by adjusting the attitude of the movable mirror 116. The attitude of the movable mirror 116 may be adjusted manually by an operator, or the controller 113 may control the attitude of the movable mirror 116 on the basis of intensity information on the EUV light supplied from a monitoring device. In the latter case, the movable mirror 116 is driven by a movable mirror driver, of which the illustration is omitted.

The LPP-type EUV light source apparatus may employ a pre-pulse process in which a single raw material is irradiated with a laser beam multiple times, as described in JP-A-2005-17274 and JP-A-2010-514214. In this process, the plasma raw material is irradiated with a first energy beam (pre-pulse, e.g., from a YAG laser) to generate a weak plasma for reducing the density of the plasma raw material. Next, the reduced density plasma is irradiated with a second energy beam (main pulse: e.g., from a $CO_2$ laser).

Reducing the density of the plasma raw material by the pre-pulse irradiation improves the absorption of the main pulse into the plasma raw material and increases the EUV radiation intensity. In addition, since the plasma is made less dense and re-absorption of EUV radiation is reduced, the EUV generation efficiency is improved and the amount of debris is reduced.

As described above, the energy beams irradiating the liquid plasma raw material SA' preferably include at least two kinds of energy beams. For example, a $CO_2$ gas laser or a solid-state laser such as a YAG laser, as well as an excimer laser such as an ArF laser, a KrF laser, or a XeCl laser can be employed as the device for irradiating the energy beams.

In the following description, for simplicity, use of a single laser is taken as an example. In addition, a laser beam LB' is used for irradiation of the plasma raw material SA' in this embodiment, but instead of the laser beam LB', an ion beam or an electron beam may be used for irradiation of the liquid plasma raw material applied to the side surface (flat surface) of a rotor.

When the plasma raw material SA' is irradiated with the plasma raw material SA' that is supplied to the outer surface of the raw material supply plate EA', the plasma raw material SA' is heated and excited to generate the plasma P'. EUV light is emitted from the plasma P'. The EUV light is used in a utilizing apparatus, which is another optical apparatus (a lithography apparatus or an inspection apparatus for masks). In this embodiment, the EUV light is used in a mask inspection apparatus.

A connection chamber 121 is located between the chamber 111 and the utilizing apparatus. The connection chamber 121 is formed of a rigid material, e.g., a metal. The connection chamber 121 is a vacuum housing, and the interior thereof is kept in a depressurized atmosphere to restrict attenuation of the EUV light in a manner similar to the interior of the chamber 111.

In the connection chamber 121, a rotating foil trap 122 that traps particles of debris DB and a heat shield panel 123 that reduces heat radiation from the plasma P' to the rotating foil trap 122 are arranged. The rotating foil trap 122 is connected to or coupled with the rotational shaft JC' of a motor MC' located outside the connection chamber 121.

The interior space of the connection chamber 121 is connected to (communicates with) the chamber 111 through a window 117, which is a through-hole formed in the wall of the chamber 111. The connection chamber 121 is spatially connected to (communicates with) the utilizing apparatus (mask inspection apparatus).

On the other hand, particles of debris are emitted from the plasma P' at high speeds in various directions along with the EUV light. The particles of debris include tin particles, which include the vaporized plasma raw material SA' and material particles of the raw material supply plate EA' sputtered by generation of the plasma P'. The particles of debris gain large kinetic energy by contraction and expansion of the plasma P'.

At least some of the particles of debris emitted toward the connection chamber 121 are trapped by a debris mitigation device such as the rotating foil trap 122, in a manner similar to in the LDP-type EUV light source apparatus. However, debris particles that travel in other directions will be likely to adhere to the interior of the EUV light source apparatus 101 (e.g., the inner wall of the chamber 111), causing inside contamination if a countermeasure is not implemented.

To prevent the inside contamination caused by scattering of the particles of debris DB as much as possible, the raw material supply plate EA', the container CA', and part of the rotational shaft JA' of the motor MA' are surrounded by a raw-material-supply-plate housing HA'. The rotational shaft JA' is connected to the raw material supply plate EA', through, for example, a hole formed in the raw-material-supply-plate housing HA' (not shown).

As shown in FIG. 28, the raw-material-supply-plate housing HA' has an EUV light outlet aperture KL' so that the EUV light emitted from the plasma P' is directed to the utilizing apparatus through the connection chamber 121. The EUV light outlet aperture KL' is also used for an inlet for the energy beam that irradiates the plasma raw material SA' that is adhered to the raw material supply plate EA' and is transported to the laser beam irradiation region. In the lowermost portion of the raw-material-supply-plate housing HA', there is provided a drain port QA' for draining the debris and the waste material that adhered to the inner surfaces of the raw-material-supply-plate housing HA' to the outside.

Most of the debris particles DB that may adhere to the interior of the EUV light source apparatus 101 are emitted in the debris scattering directions D1' and D2' and are captured in the raw-material-supply-plate housing HA'. In addition, only a small amount of the plasma raw material SA' adhered to the raw material supply plate EA' and transported to the laser beam irradiation region is heated by irradiation of the energy beam for plasma generation. Therefore, most of the plasma raw material SA' adhered to the raw material supply plate EA' is returned to the container CA' without being used, and some of it falls by the force of gravity and is captured in the raw-material-supply-plate housing HA' instead of returning to the container CA'. Furthermore, for some problem, some of the liquid-phase plasma raw material SA' stored in the container CA' may overflow from the container CA'. The overflowing plasma raw material SA' leaks out in material leakage directions D3' and is captured as a waste material in the raw-material-supply-plate housing HA'.

Since the raw-material-supply-plate housing HA' is located near the plasma P', it is heated above the melting point of the debris DB and the waste materials by EUV radiation from the plasma P'. In this specification, the melting point is referred to as the melting point of the plasma raw material SA' such as tin. Thus, in a case in which the raw material supply plate EA' is formed of, for example, a high-melting-point metal such as tungsten, molybdenum, or tantalum, the melting point of the debris DB is not influenced by the melting point of the raw material supply plate EA' even when the particles of debris DB contain particles of the material of the raw material supply plate EA'. Accordingly, tin contained in the debris DB and the waste material adhering to the inner surfaces of the raw-material-supply-plate housing HA' remains in liquid phase without solidification. The debris DB and the waste material that adhered to the inner surfaces of the raw-material-supply-plate housing HA' gather in the lowermost portion of the raw-material-supply-plate housing HA' by the force of gravity, and are drained from the drain port QA' to the outside, thereby falling in the vertical direction.

For storing the debris DB generated in the light source part 112 and the debris DB trapped by the debris mitigation device, the debris storage part 4 shown in FIG. 2 is provided also in the LPP-type EUV light source apparatus 101. For guiding the debris DB and waste material adhering to the inner surfaces of the raw-material-supply-plate housing HA' into the debris storage part 4, the debris guiding part 5 is provided also in the LPP-type EUV light source apparatus 101.

The debris DB and the waste material that fall in the vertical direction from the drain port QA' are received by a receiving plate member 18 of the debris guiding part 5. The receiving plate 18 is supported by a supporting stage disposed in the connection chamber 121. The supporting-stage supports the receiving plate 18 in an inclined attitude. The receiving plate member 18 is heated by heating means, so that the temperature thereof is maintained above the melting point of tin. Therefore, the debris DB and the waste material that fell onto the receiving plate member 18 from the drain port QA' are in liquid phase and move along the receiving surface 71 of the inclined receiving plate member 18 to the drain portion 73 of the receiving plate member 18, so that they are stored in the debris storage vessel 31.

As shown in FIG. 7, the corrosion-resistant plate P1 is disposed on the receiving surface 71 of the receiving plate member 18 also in the LPP-type EUV light source apparatus 101. The corrosion-resistant plate can reduce the reaction of the debris DB and waste materials such as tin heated above the melting point with the stainless steel, which is the base material of the receiving plate member 18, thereby preventing the receiving plate member 18 from corrosion.

The corrosion-resistant plate P2 (FIG. 18), P3 (FIG. 21), P4 (FIG. 22), P5 (FIG. 24), or P6 (FIG. 26) may be disposed on the receiving surface 71 of the receiving plate member 18 also in the LPP-type EUV light source apparatus 101.

Embodiments of the present invention have been described. However, the present invention is not limited to the embodiments described above, but rather includes various variations. For example, it is possible to replace some of elements in one embodiment with elements in another embodiment, and it is also possible to add elements in an embodiment to the configuration of another embodiment. It is also possible to add, delete, or replace some of elements in each embodiment.

For example, in the above-described embodiments, the corrosion-resistant plate made of a corrosion-resistant member is disposed on the receiving surface of the receiving plate member as an example. In another example, a corrosion-resistant film may be formed on the receiving surface of the receiving plate member to protect the receiving surface of the receiving plate member. The material of the corrosion-resistant film may be tungsten, molybdenum, titanium nitride, SiC, or an oxide film. Alternatively, the corrosion-resistant plate may be made of a material with good thermal conductivity, such as aluminum, and the corrosion-resistant plate may be coated with a passivation film or any other corrosion-resistant film. When forming the corrosion-resistant film on the receiving surface of the receiving plate member, the film may be deposited by sputtering or by plasma CVD (Chemical Vapor Deposition).

The invention claimed is:

1. An extreme ultraviolet light source apparatus, comprising:

a light source part configured to generate a plasma that emits extreme ultraviolet light with use of excitation of a raw material for emitting extreme ultraviolet light;

a storage vessel configured to store a melt of a waste material including the raw material and a melt of particles of debris that are emitted from the plasma;

a receiving plate member having a receiving surface; and a corrosion-resistant member disposed on the receiving surface of the receiving plate member, the corrosion-resistant member being more corrosion-resistant to the melt of the waste material and the melt of the debris than the receiving plate member, the corrosion-resistant member receiving the melt of the waste material and the melt of the debris and guiding the melt of the waste material and the melt of the debris into the storage vessel; and a supporting member configured to support the receiving plate member in an inclined attitude such that de melt of the waste material and the melt of the debris move down toward the storage vessel, wherein the supporting member has an upper surface for supporting the receiving plate member, a lower surface opposite to the upper surface, and a lower edge, and wherein the lower surface has a hollow space to make the lower edge of the support member in line contact with a surface that is disposed below the supporting member.

2. The extreme ultraviolet light source apparatus according to claim 1, wherein the light source part includes a pair of disk-shaped discharge electrodes spaced apart from each other;

motors each configured to rotate the corresponding discharge electrode about a rotational shaft thereof;

containers each configured to store the raw material in liquid phase such that a portion of the corresponding discharge electrode is immersed in the raw material;

at least one electrode housing surrounding the discharge electrodes and the containers; and a chamber surrounding the electrode housing and having a window through which the extreme ultraviolet light passes out, wherein the electrode housing has an aperture through which the extreme ultraviolet light passes out; and a drain port configured to drain the melt of the waste material including the raw material leaking out of the containers and the melt of the debris adhering to inner walls of the electrode housing, and wherein the receiving plate member is configured to be heated above the melting point of the waste material and the debris, and to be supported in an inclined attitude such that the melt of the waste material and the melt of the debris move down toward the storage vessel.

3. The extreme ultraviolet light source apparatus according to claim 2, further comprising:

a pulse power supply configured to supply pulse electric power to the discharge electrodes; and an energy beam irradiator configured to irradiate the raw material in liquid phase adhering to an outer surface of one of the discharge electrodes with an energy beam when the discharge electrodes are rotated, thereby vaporizing the raw material.

4. The extreme ultraviolet light source apparatus according to claim 1, wherein the light source part includes:

a disk-shaped raw material supply plate;

a motor configured to rotate the raw material supply plate about a rotational shaft thereof;

a container configured to store the raw material in liquid phase such that a portion of the raw material supply plate is immersed in the raw material;

a raw-material-supply-plate housing surrounding the raw material supply plate and the container; and a chamber surrounding the raw-material-supply-plate housing and having a window through which the extreme ultraviolet light passes out, wherein the raw-material-supply-plate housing has an aperture through which the extreme ultraviolet light passes out; and a drain port configured to drain the melt of the waste material including the raw material leaking out of the container and the melt of the debris adhering to inner walls of the raw-material-supply-plate housing, and wherein the receiving plate member is configured to be heated above the melting point of the waste material and the debris, and to be supported in an inclined attitude such that the melt of the waste material and the melt of the debris move down toward the storage vessel.

5. The extreme ultraviolet light source apparatus according to claim 4, further comprising an energy beam irradiator configured to irradiate the raw material in liquid phase adhering to an outer surface of the raw material supply plate with an energy beam when the raw material supply plate is rotated, thereby plasmizing the raw material.

6. The extreme ultraviolet light source apparatus according to claim 5, further comprising:

a foil trap configured to trap particles of the debris emitted together with the extreme ultraviolet through the window;

a heat shield panel configured to reduce heat radiation to the foil trap from the window; and a connection chamber connected to the chamber so as to surround the foil trap and the heat shield panel, and having a through-hole that communicates with the storage vessel, wherein the melt of the waste material and the melt of the debris guided through the corrosion-resistant member on the receiving plate member, the melt of the debris trapped by the foil trap, and the melt of the debris adhered to the heat shield panel are stored into the storage vessel via the through-hole.

7. The extreme ultraviolet light source apparatus according to claim 4, further comprising:

a foil trap configured to trap particles of the debris emitted together with the extreme ultraviolet through the window;

a heat shield panel configured to reduce heat radiation to the foil trap from the window; and a connection chamber connected to the chamber so as to surround the foil trap and the heat shield panel, and having a through-hole that communicates with the storage vessel, wherein the melt of the waste material and the melt of the debris guided through the corrosion-resistant member on the receiving plate member, the melt of the debris trapped by the foil trap, and the melt of the debris adhered to the heat shield panel are stored into the storage vessel via the through-hole.

8. The extreme ultraviolet light source apparatus according to claim 1, wherein the corrosion-resistant member is a corrosion-resistant plate disposed on the receiving surface of the receiving plate member or a corrosion-resistant film that coats the receiving surface of the receiving plate member.

9. The extreme ultraviolet light source apparatus according to claim 1, wherein the hollow space has an upward slope that prevents the melt of the debris and the melt of the waste material from rising.

10. An extreme ultraviolet light source apparatus, comprising:
a light source part configured to generate a plasma that emits extreme ultraviolet light with use of excitation of a raw material for emitting extreme ultraviolet light;
a storage vessel configured to store a melt of a waste material including the raw material and a melt of particles of debris that are emitted from the plasma;
a receiving plate member having a receiving surface; and
a corrosion-resistant member disposed on the receiving surface of the receiving plate member, the corrosion-resistant member being more corrosion-resistant to the melt of the waste material and the melt of the debris than the receiving plate member, the corrosion-resistant member receiving the melt of the waste material and the melt of the debris and guiding the melt of the waste material and the melt of the debris into the storage vessel,
wherein the light source part includes
a pair of disk-shaped charge electrodes spaced apart from each other;
motors each configured to rotate the corresponding discharge electrode about a rotational shaft thereof;
containers each configured to store the raw material in liquid phase such that a portion of the corresponding discharge electrode is immersed in the raw material;
at least one electrode housing surrounding the discharge electrodes and the containers; and
a chamber surrounding the electrode housing and having a window through which the extreme ultraviolet light passes out,
wherein the electrode housing has
an aperture through which the extreme ultraviolet light passes out; and
a drain port configured to drain the melt of the waste material including the raw material leaking out of the containers and the melt of the debris adhering to inner walls of the electrode housing, and
wherein the receiving plate member is configured to be heated above the melting point of the waste material and the debris, and to be supported in an inclined attitude such that the melt of the waste material and the melt of the debris move down toward the storage vessel, and
the extreme ultraviolet light source apparatus further comprises:
a foil trap configured to trap particles of the debris emitted together with the extreme ultraviolet through the window;
a heat shield panel configured to reduce heat radiation to the foil trap from the window; and
a connection chamber connected to the chamber so as to surround the foil trap and the heat shield panel, and having a through-hole that communicates with the storage vessel,
wherein the melt of the waste material and the melt of the debris guided through the corrosion-resistant member on the receiving plate member, the melt of the debris trapped by the foil trap, and the melt of the debris adhered to the heat shield panel are stored into the storage vessel via the through-hole.

11. An extreme ultraviolet light source apparatus, comprising:
a light source part configured to genera e a plasma that emits extreme ultraviolet light with use of excitation of a raw material for emitting extreme ultraviolet light;
a storage vessel configured to store a melt of a waste material including the raw material and a melt of particles of debris that are emitted from the plasma;
a receiving plate member having a receiving surface; and
a corrosion-resist member disposed on the receiving surface of the receiving plate member, the corrosion-resistant member being more corrosion-resistant to the melt of the waste material and the melt of the debris than the receiving plate member, the corrosion-resistant member receiving the melt of the waste material and the melt of the debris and guiding the melt of the waste material and the melt of the debris into the storage vessel,
wherein the corrosion-resistant member is a corrosion-resistant plate disposed on the receiving surface of the receiving plate member,
wherein the corrosion-resistant plate has a lower end that protrudes from a lower end of the receiving plate member, and
wherein the lower end of the corrosion-resistant plate is located above an inlet opening of the storage vessel.

12. The extreme ultraviolet light source apparatus according to claim 11, wherein the lower end of the corrosion-resistant plate is bent to extend along a direction in which the melt of the waste material and the melt of the debris fall.

13. The extreme ultraviolet light source apparatus according to claim 11, wherein the lower end of the corrosion-resistant plate has a protrusion having a width gradually narrowing toward a lowermost edge thereof.

14. The extreme ultraviolet light source apparatus according to claim 11, wherein the lower end of the corrosion-resistant plate has an upper surface having a groove extending along a side edge of the lower end of the corrosion-resistant plate.

15. The extreme ultraviolet light source apparatus according to claim 11, wherein the corrosion-resistant plate is formed of molybdenum or tungsten.

* * * * *